(12) United States Patent
Fukuda

(10) Patent No.: US 8,304,796 B2
(45) Date of Patent: Nov. 6, 2012

(54) LIGHT-EMITTING APPARATUS

(75) Inventor: Koichi Fukuda, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 167 days.

(21) Appl. No.: 12/679,379

(22) PCT Filed: Nov. 13, 2008

(86) PCT No.: PCT/JP2008/071059
§ 371 (c)(1),
(2), (4) Date: Mar. 22, 2010

(87) PCT Pub. No.: WO2009/064019
PCT Pub. Date: May 22, 2009

(65) Prior Publication Data
US 2010/0219427 A1  Sep. 2, 2010

(30) Foreign Application Priority Data

Nov. 14, 2007 (JP) .................................. 2007-295974
Oct. 29, 2008 (JP) ................................ 2008-278327

(51) Int. Cl.
*H01L 33/10* (2010.01)
(52) U.S. Cl. ............ 257/98; 257/E25.032; 257/E33.001; 257/E33.067; 257/E33.068; 257/E33.069; 313/483; 313/498; 313/505; 385/4; 385/130; 385/131; 359/326; 359/558; 359/563; 359/566; 359/569
(58) Field of Classification Search .................... 257/40, 257/89, E51.021, E51.022, 98, E25.032, 257/E33.001, E33.067–E33.069; 313/483; 313/498, 505; 385/4, 130, 131; 359/326, 359/558, 563, 566, 569
See application file for complete search history.

(56) References Cited

U.S. PATENT DOCUMENTS

| | | | |
|---|---|---|---|
| 6,406,801 B1 | 6/2002 | Tokito et al. | 428/690 |
| 6,476,550 B1 * | 11/2002 | Oda et al. | 313/504 |
| 6,630,684 B2 * | 10/2003 | Lee et al. | 257/40 |
| 7,292,753 B2 * | 11/2007 | Cohen et al. | 385/37 |
| 7,538,487 B2 | 5/2009 | Hasegawa et al. | 313/504 |

(Continued)

FOREIGN PATENT DOCUMENTS

JP    11-283751    10/1999

(Continued)

OTHER PUBLICATIONS

R.H. Jordan et al., "Efficiency enhancement of microcavity organic light emitting diodes," Appl. Phys. Lett. vol. 69, No. 14, Sep. 30, 1996, pp. 1997-1999.

(Continued)

*Primary Examiner* — Matthew W Such
*Assistant Examiner* — William Harriston
(74) *Attorney, Agent, or Firm* — Fitzpatrick, Cella, Harper & Scinto

(57) ABSTRACT

Provided is a light-emitting apparatus in which light extraction efficiency of a light-emitting device is improved and viewing angle dependency of an emission color is reduced. The light-emitting apparatus includes a cavity structure and a periodic structure. When guided-wave light is diffracted by the periodic structure in a direction that forms an angle which is larger than 90° and smaller than 180° relative to a guided-wave direction of an optical waveguide in the cavity structure, a wavelength of the diffracted light becomes longer as the diffraction angle increases.

13 Claims, 18 Drawing Sheets

U.S. PATENT DOCUMENTS

| | | | |
|---|---|---|---|
| 7,633,056 B2 * | 12/2009 | Gaugiran et al. | 250/251 |
| 7,671,528 B2 | 3/2010 | Fukuda et al. | 313/501 |
| 7,759,861 B2 * | 7/2010 | Fujimoto et al. | 313/506 |
| 7,868,542 B2 * | 1/2011 | Fukuda | 313/506 |
| 7,991,257 B1 * | 8/2011 | Coleman | 385/129 |
| 8,227,825 B2 * | 7/2012 | Diana et al. | 257/98 |
| 8,242,521 B2 * | 8/2012 | David et al. | 257/95 |
| 2003/0057417 A1 | 3/2003 | Lee et al. | 257/40 |
| 2003/0198266 A1 * | 10/2003 | Ekawa | 372/45 |
| 2005/0023537 A1 * | 2/2005 | Salam | 257/79 |
| 2005/0062903 A1 * | 3/2005 | Cok et al. | 349/69 |
| 2006/0066230 A1 | 3/2006 | Kubota et al. | 313/506 |
| 2006/0158098 A1 * | 7/2006 | Raychaudhuri et al. | 313/503 |
| 2006/0169881 A1 * | 8/2006 | Shieh et al. | 250/237 R |
| 2006/0220010 A1 * | 10/2006 | Wang et al. | 257/40 |
| 2007/0153543 A1 * | 7/2007 | Xu et al. | 362/600 |
| 2007/0236135 A1 * | 10/2007 | Fukuda et al. | 313/503 |
| 2008/0067926 A1 | 3/2008 | Mizuno et al. | 313/504 |
| 2008/0138013 A1 * | 6/2008 | Parriaux | 385/37 |
| 2008/0185954 A1 | 8/2008 | Fukuda et al. | 313/483 |
| 2008/0303419 A1 * | 12/2008 | Fukuda | 313/504 |
| 2009/0021151 A1 | 1/2009 | Fukuda | 313/504 |
| 2010/0136724 A1 * | 6/2010 | Mary et al. | 438/26 |
| 2010/0181899 A1 * | 7/2010 | Forrest et al. | 313/504 |
| 2010/0283068 A1 * | 11/2010 | Buckley et al. | 257/89 |
| 2011/0090697 A1 * | 4/2011 | Matsuzaki et al. | 362/293 |
| 2011/0151607 A1 * | 6/2011 | Landis et al. | 438/46 |
| 2011/0213094 A1 * | 9/2011 | Fechner et al. | 525/326.7 |

FOREIGN PATENT DOCUMENTS

| | | |
|---|---|---|
| JP | 11-288786 | 10/1999 |
| JP | 2991183 B2 | 12/1999 |
| JP | 2002-110362 | 4/2002 |
| JP | 2003-109749 | 4/2003 |
| JP | 2003-163075 | 6/2003 |
| JP | 2006-100430 | 4/2006 |

OTHER PUBLICATIONS

M.-H. Lu et al., "High-efficiency top-emitting organic light-emitting devices," Applied Physic Letters, vol. 81, No. 21, Nov. 18, 2002.

Huajun Peng et al., High-efficiency microcavity top-emitting organic light-emitting diodes using silver anode, vol. 88, 2006, pp. 073517-1-073517-3.

* cited by examiner

540nm

520nm

LIGHT-EMITTING APPARATUS

TECHNICAL FIELD

The present invention relates to a light-emitting apparatus.

BACKGROUND ART

An organic electroluminescent (EL) display, being a kind of light-emitting apparatus, is a new type of flat panel display and formed from an array of organic light emitting diode (OLED) devices. In general, an OLED device is comprised of an electrode serving as the anode, an electrode serving as the cathode and several thin organic layers sandwiched between these two electrodes. The organic layers include at least one emission layer. The emission layer is formed of a fluorescent organic compound, phosphorescent organic compound or a light emitting materials such as a quantum dot (QD) to emit light at each emission color. Applying voltage to the OLED device, holes and electrons are injected from the anode and the cathode, respectively, and form excitons in the emission layer. Then these excitons recombine and release their energy as emission of light.

One of the tasks to be accomplished in development of such an organic light-emitting apparatus is improvement of the emission efficiency. The OLED device generally has such a structure that an anode, an organic layer including a emission layer, and a cathode are one-dimensionally stacked. At this time, the refractive index (approximately 1.7 to 1.9) of the emission layer is larger than the refractive index of air. Therefore, most of light emitted from the inside of the emission layer is totally reflected at an interface of the stack film at which a high refractive index changes to a low refractive index. The totally reflected light becomes guided-wave light propagating in a horizontal direction of a substrate, and then is confined inside the OLED device. The ratio of light which can be extracted for use to the outside (light extraction efficiency) is generally only approximately 20%.

Therefore, in order to improve the emission efficiency of the organic light-emitting apparatus, it is important to improve the light extraction efficiency. Among conventional technologies, for example, "Appl. Phys. Lett., 69, 1997 (1996)", "Appl. Phys. Lett., 81, 3921 (2002)", and "Appl. Phys. Lett., 88, 073517 (2006)" each describe that, when a cavity structure is introduced into the OLED device to make use of an interference effect, the light extraction efficiency can be improved.

In addition to the conventional technologies described above, for example, Japanese Patent No. 2,991,183 (Japanese Patent Application Laid-Open No. H11-283751) proposes a method involving providing a periodic structure (such as photonic crystal or diffraction grating) in an upper or lower portion of an organic layer (on a light extraction side or on a side opposite thereto), in order to prevent total reflection to thereby suppress light confinement inside the OLED device.

The conventional technologies described in each of "Appl. Phys. Lett., 69, 1997 (1996)" and "Appl. Phys. Lett., 81, 3921 (2002)" have a problem that when the interference effect of the cavity is enhanced to improve the light extraction efficiency, a viewing angle dependency of a light emission pattern of the OLED device becomes larger, resulting in a change of emission color depending on the viewing angle.

Even in the conventional technology described in Japanese Patent No. 2,991,183 (Japanese Patent Application Laid-Open No. H11-283751), when the periodic structure is provided to improve the light extraction efficiency, there is a problem that the viewing angle dependency of the light emission pattern of the OLED device becomes larger due to wavelength dependency of a diffraction effect, resulting in a change in emission color depending on a viewing angle.

DISCLOSURE OF THE INVENTION

The present invention has been accomplished in view of the problems described above, and it is, therefore, an object of the present invention to provide a light-emitting apparatus in which light extraction efficiency of a light-emitting device is improved to reduce the viewing angle dependency of the emission color.

In order to solve the problems of the background art, the light-emitting apparatus according to an aspect of the present invention includes:

a substrate;

a plurality of light-emitting devices formed on the substrate and each including:

a first electrode formed on the substrate;

a emission layer formed on the first electrode; and a second electrode formed on the emission layer;

a cavity structure for resonating light emitted from the emission layer between a first reflective surface and a second reflective surface, the first reflective surface being located on the first electrode side relative to the emission layer, the second reflective surface being located on the second electrode side relative to the emission layer; and a periodic structure for extracting guided-wave light generated between the first reflective surface and the second reflective surface to outside, wherein when the guided-wave light is diffracted by the periodic structure at an angle which is larger than 90° and smaller than 180° relative to a guided-wave direction, a wavelength of the diffracted guided-wave light becomes longer as the angle increases.

Further features of the present invention will become apparent from the following description of exemplary embodiments with reference to the attached drawings.

BEST MODE FOR CARRYING OUT THE INVENTION

Figure 1:
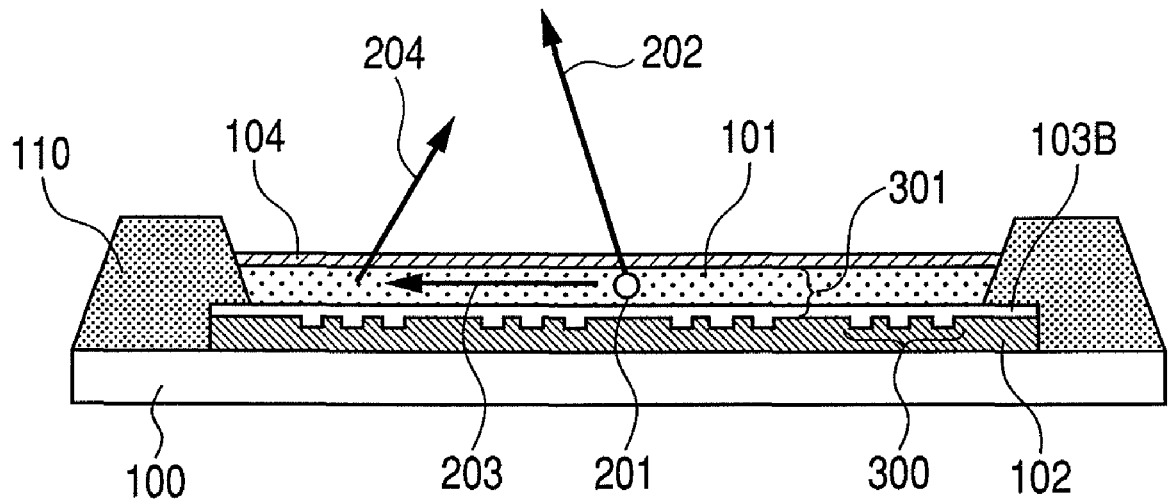
FIG. 1 is a schematic cross-sectional view illustrating an organic light-emitting apparatus including reflective surfaces with a periodic structure.

Hereinafter, the principle of the present invention will be described with reference to structural examples.
(Embodiment 1)
FIG. 1 is a schematic cross-sectional view illustrating an organic light-emitting apparatus having both a cavity structure and a periodic structure. FIG. 1 illustrates the organic light-emitting apparatus. However, even in a case of an inorganic light-emitting apparatus or a QD-LED apparatus, the present invention can be embodied.

The organic light-emitting apparatus illustrated in FIG. 1 includes an OLED device (light-emitting device). In the OLED device, a reflective electrode (first electrode) 102 serving as an anode is formed on a substrate 100. The reflective electrode 102 has a periodic structure 300 formed in a part of a surface thereof on a side which is opposite to the substrate 100 side. The periodic structure 300 is covered with a transparent electrode 103B located on the reflective electrode 102 and planarized. A device separation film 110 which is made of an insulating material is formed to cover the peripheral edge of the anode. An organic layer 101 containing a fluorescent organic compound or a phosphorescent organic compound is stacked on a portion of the anode which is exposed through an opening portion of the device separation film 110. A translucent metal electrode (second electrode) 104 serving as a cathode is formed on the organic layer 101.

Figure 2:
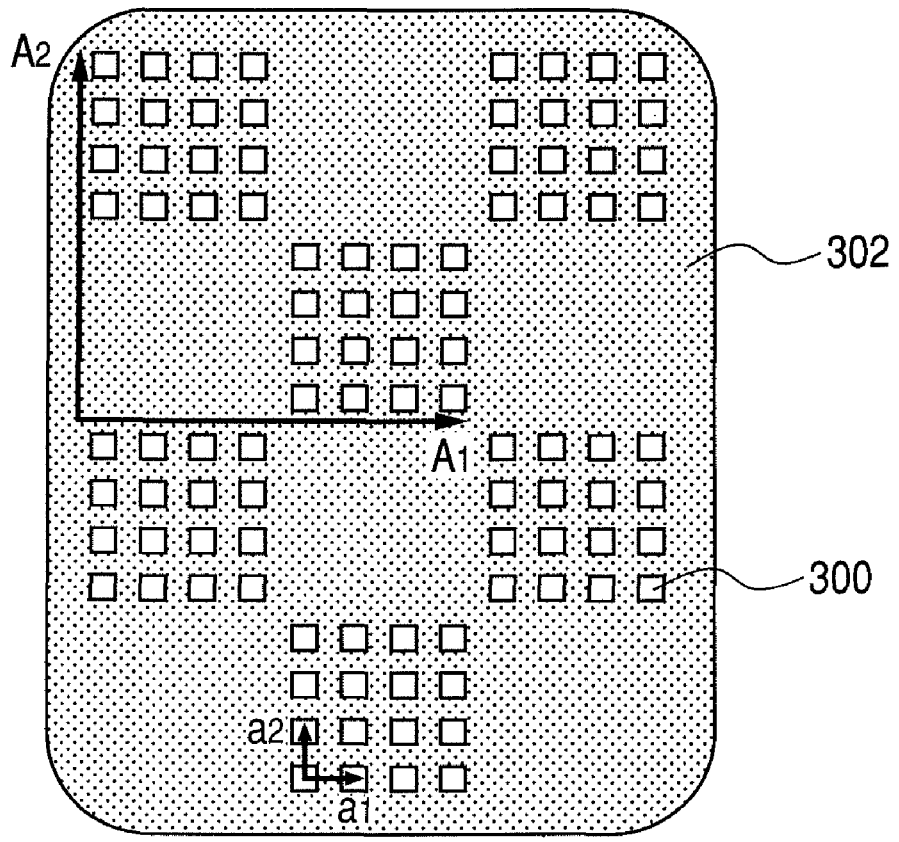
FIG. 2 is a schematic plan view illustrating the organic light-emitting apparatus including the reflective surfaces with the periodic structure.

As illustrated in FIG. 2, the periodic structure 300 in this Embodiment 1 is a structure in which a two-dimensional photonic crystal structure (periodic structure 300) region and a flat region are mixedly present within an EL region 302. The EL region 302 illustrated in FIG. 2 corresponds to a stacked portion including the reflective electrode 102, the organic layer 101, and the metal translucent electrode 104 as illustrated in FIG. 1.

Figure 3:
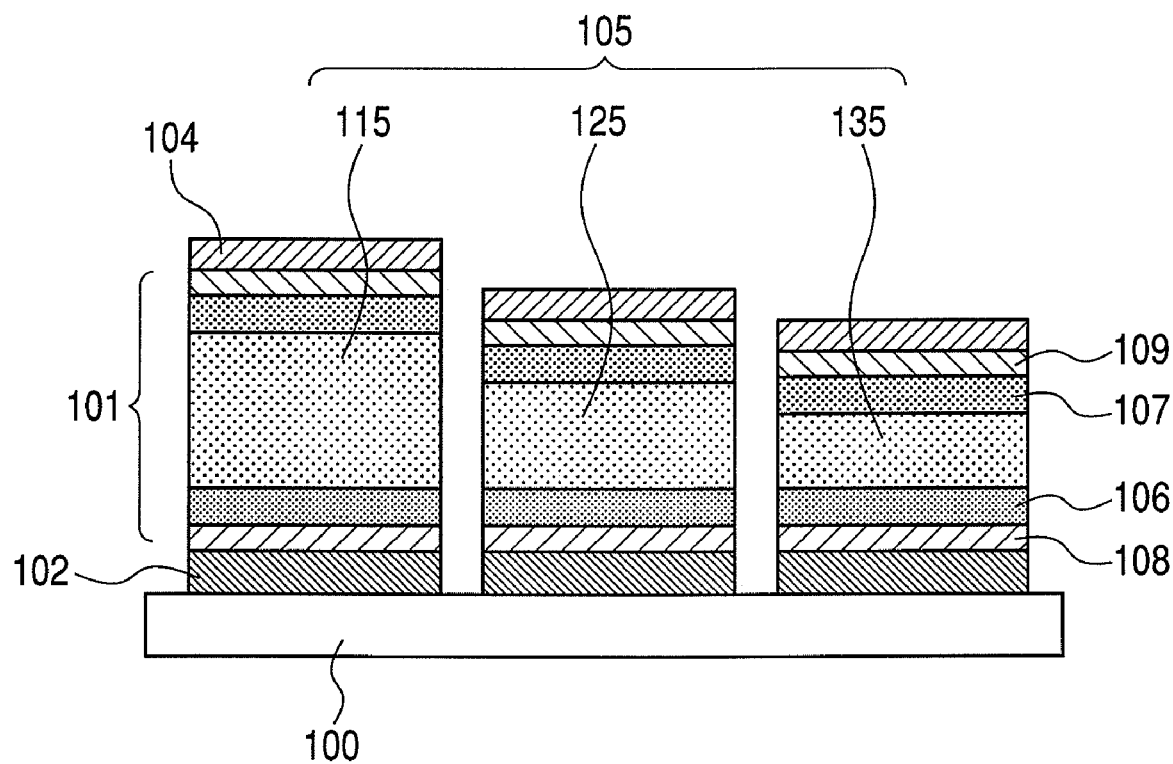
FIG. 3 is a schematic cross-sectional view illustrating an organic layer.

As illustrated in FIG. 3, the organic layer 101 normally has a structure in which a hole-transport layers 106, a emission layer 105 (including an R-emission layer 115, a G-emission layer 125, and a B-emission layer 135), and an electron-transport layer 107 are stacked. The emission layer 105 contains a fluorescent organic compound or a phosphorescent organic compound, which corresponds to its emission color. If necessary, a hole-injection layer 108 may be interposed between the anode 102 and the hole-transport layer 106, and an electron-injection layer 109 may be interposed between the cathode 104 and the electron-transport layer 107.

When a voltage is applied to the OLED device, holes are injected from the anode into the organic layer 101 and electrons are injected from the cathode into the organic layer 101. The injected holes and electrons form excitons in the emission layer 105. When the excitons recombine, light (spontaneous emission light) is emitted from the emission layer 105. In the structural example of the OLED device illustrated in FIG. 1, the translucent metal electrode 104 side relative to a light emission point 201 is defined as a light extraction side.

In the structural example illustrated in FIG. 1, the reflective electrode 102 and the translucent metal electrode 104 which sandwich the organic layer 101 are used as a first reflective surface and a second reflective surface, respectively, thereby obtaining an optical cavity having a structure which is one-dimensional in a direction perpendicular to the substrate 100. The translucent metal electrode 104 side (second electrode side) relative to the light emission point 201 is the light extraction side. The reflective electrode 102 side (first electrode side) relative to the light emission point 201 is a reflective surface side. The optical cavity also serves as a planar optical waveguide 301 in a direction parallel to the substrate 100.

Figure 4:
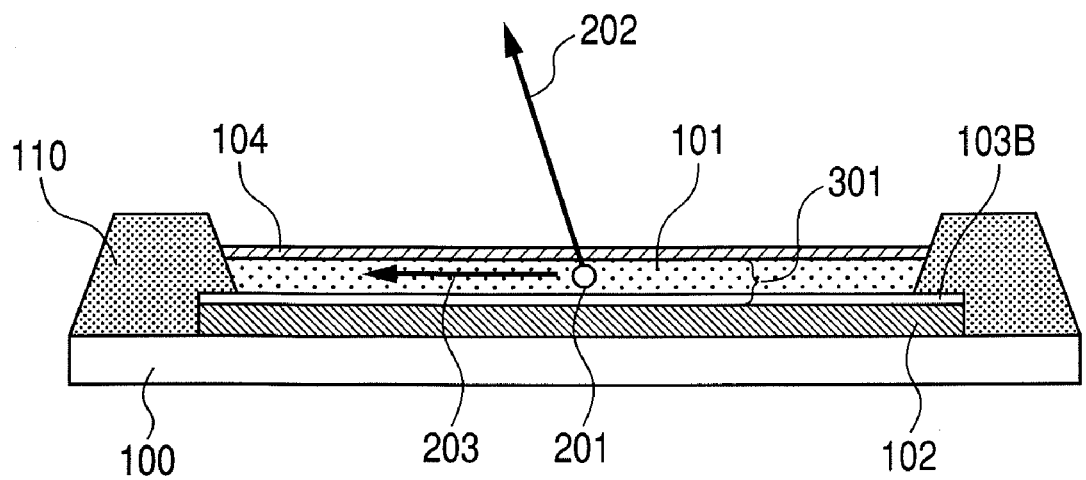
FIG. 4 is a schematic cross-sectional view illustrating an organic light-emitting apparatus including reflective surfaces having no periodic structure.

Light emitted from the light emission point 201 is divided into propagating light 202 traveling to the light extraction side and guided-wave light 203 traveling through the optical waveguide 301 in the direction parallel to the substrate. The guided-wave light 203 is extracted as diffraction light 204 from the light extraction side to the outside of the light-emitting device by the periodic structure 300. Therefore, unlike the case where the periodic structure 300 is not provided and thus the guided-wave light 203 cannot be extracted to the outside, as illustrated in FIG. 4, the ratio of light which is extracted to the outside of the light-emitting device (light extraction efficiency) can be increased.

Figure 5:
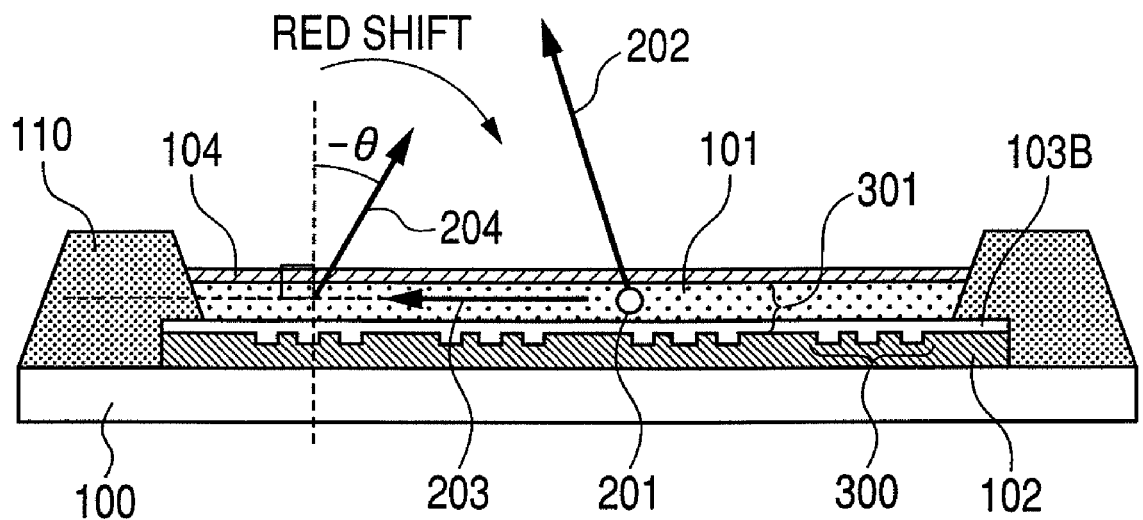
FIG. 5 is a schematic view illustrating angle dependency of diffraction light in a negative-angle direction in the organic light-emitting apparatus including the reflective surfaces with the periodic structure.

As described later, the period of the periodic structure 300 is set such that the diffraction angle of the diffraction light 204 becomes larger than 90° relative to the traveling direction of the guided-wave light 203. As illustrated in FIG. 5, when the normal to the substrate is taken as a reference, the diffraction angle is a negative angle. Hereinafter, diffraction in a direction having an angle larger than 90° relative to the traveling direction of the guided-wave light 203 is referred to as "negative diffraction". Therefore, the period of the periodic structure 300 is set such that negative diffraction light is produced from the guided-wave light which is to be extracted to the outside.

Figure 6:
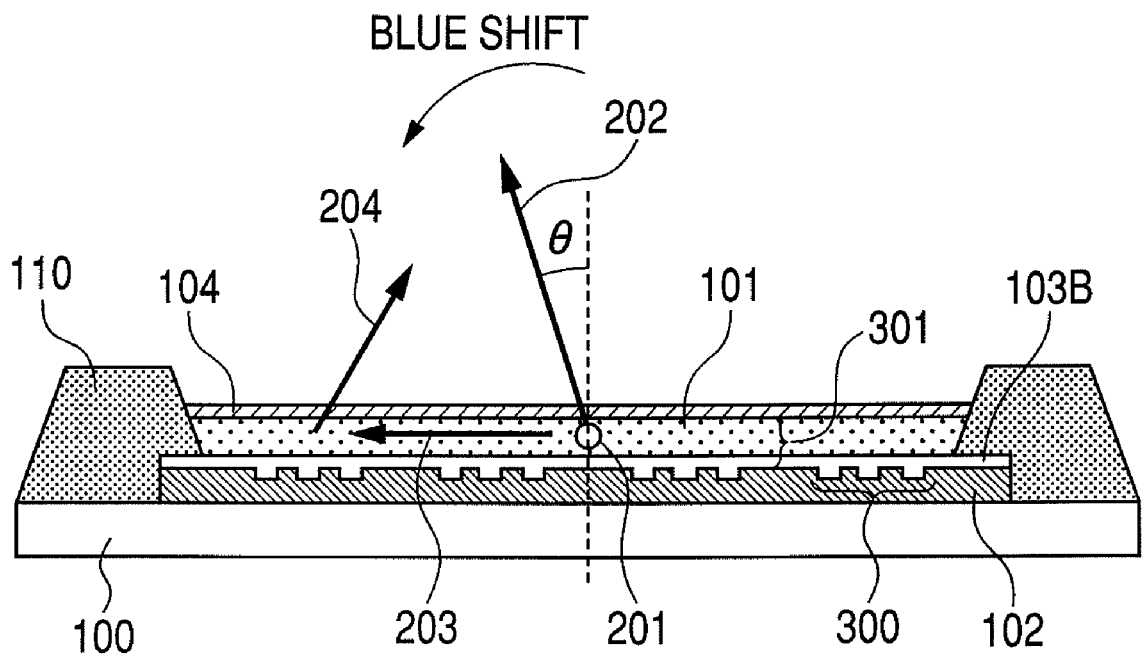
FIG. 6 is a schematic view illustrating angle dependency of an optical cavity in the organic light-emitting apparatus including the reflective surfaces with the periodic structure.

As illustrated in FIG. 5, in a region in which the periodic structure 300 is provided, light emitted as the negative diffraction light to the outside of the light-emitting device causes long-wavelength shift (red shift) with increase of the viewing angle. On the other hand, as illustrated in FIG. 6, in a region in which the periodic structure 300 is not provided, the propagating light 202 emitted to the outside of the light-emitting device causes short-wavelength shift (blue shift) with increase of the viewing angle, because of the optical cavity. Therefore, when the two effects are canceled out with each other, a change in the viewing angle of the light-emitting device can be suppressed.

Thus, according to the present invention, the light extraction efficiency of the light-emitting device can be improved and the viewing angle dependency of emission color can be reduced.

Hereinafter, the present invention will be described in more detail.

Figure 7:
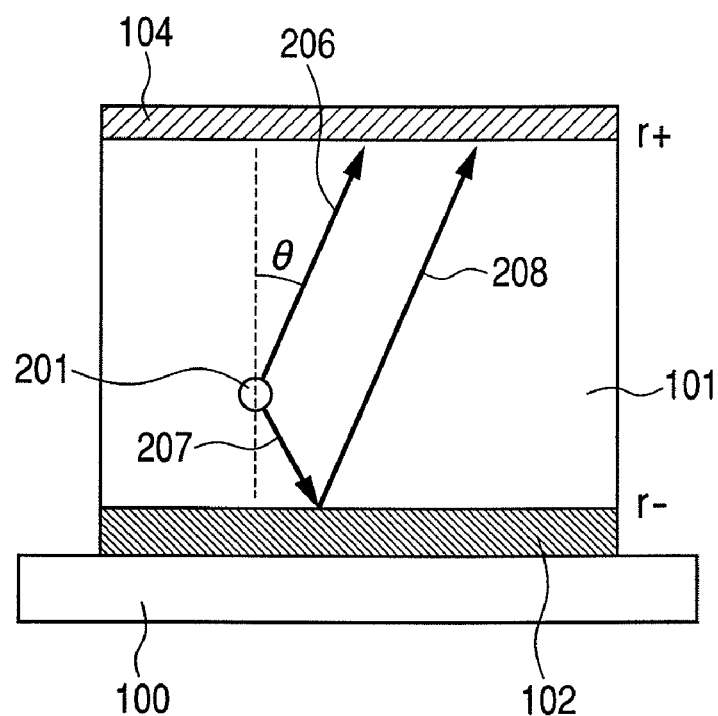
FIG. 7 is a schematic view illustrating wide-angle interference of light in an optical cavity.
Figure 8:
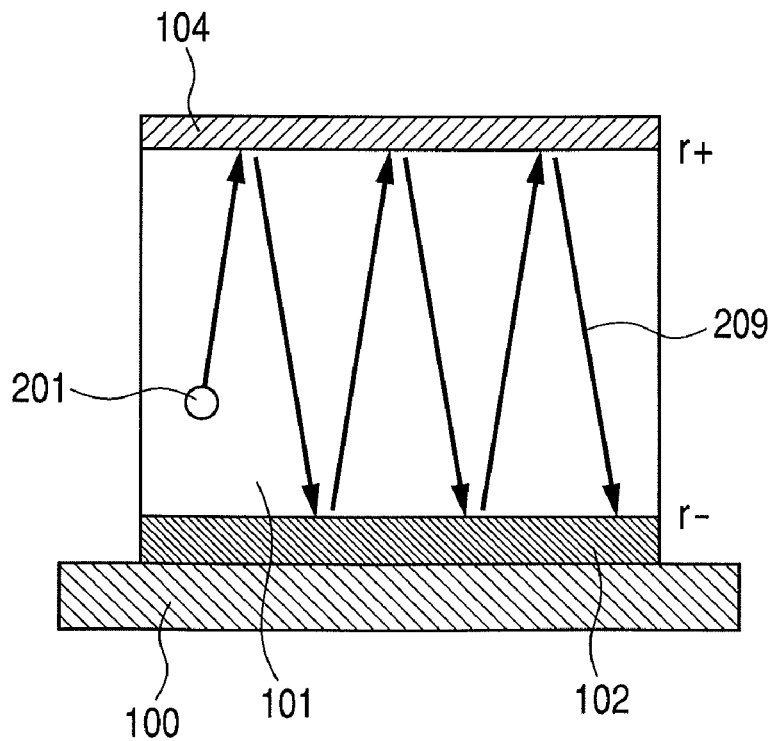
FIG. 8 is a schematic view illustrating multiple interference of light in an optical cavity.

In the region in which the periodic structure 300 is not provided, the optical cavity having the structure which is one-dimensional in the direction perpendicular to the substrate is obtained. In the optical cavity, light-emitting characteristics of the spontaneous emission light are changed by two interference effects resulting from wide-angle interference and multiple interference. FIG. 7 is a concept view illustrating the wide-angle interference. Emission light 206 which will travel to the light extraction side and emission light 207 which will travel to the reflective surface side are generated from the light emission point 201. The emission light 207 traveling to the reflective surface side is reflected by the reflective electrode 102 serving as the first reflective surface upwardly to become reflection light 208, thereby interfering with the emission light 206 traveling to the light extraction side. FIG. 8 is a concept view illustrating the multiple interference. Emission light from the light emission point 201 is reflected plural times between the first reflective surface and the second reflective surface, whereby the multiple interference occurs with a large number of reflection light beams in the optical cavity.

An emission intensity $I(\lambda)$ for a wavelength $\lambda$ (wave number $k=2\pi/\lambda$) of the OLED device having the optical cavity is proportional to the right side of Expression 1. Here, the complex reflection coefficient of the second reflective surface located on the light extraction side is represented by $r_+=|r_+|\exp(i\phi_+)$, the complex reflection coefficient of the first reflective surface located on the reflective surface side is represented by $r_-=|r_-|\exp(i\phi_-)$, and the refractive index of the organic layer 101 is represented by "n". In addition, the film thickness is represented by "d", the distance between the light emission point 201 and the first reflective surface is represented by d_, and the angle relative to the direction normal to the substrate is represented by θ. The numerator of the right side of Expression 1 indicates the effect of wide-angle interference and the denominator of the right side of Expression 1 indicates the effect of multiple interference.

$$I(\lambda) \propto \left| \frac{1 + r_- \exp[i2nkd_- \cos[i2\theta]]}{1 - r_+ r_- \exp[i2nkd\cos\theta]} \right|^2 \quad \text{(Expression 1)}$$

From the numerator of the right side of Expression 1, the interference condition for enhancing the wide-angle interference is expressed as an integer m_ by Expression 2. Further, from the denominator of the right side of Expression 1, the interference condition for enhancing the multiple interference is expressed as an integer m by Expression 3. Here, $\phi_-$ represents a phase shift on the first reflective surface and $\phi_+$ represents a phase shift on the second reflective surface.

$$\frac{2nd_-}{\lambda}\cos\theta + \frac{\phi_-}{2\pi} = m_- \quad \text{(Expression 2)}$$

$$\frac{2nd}{\lambda}\cos\theta + \frac{\phi_- + \phi_+}{2\pi} = m \quad \text{(Expression 3)}$$

The interference conditions shown by Expressions 2 and 3 indicate that the wavelength λ at which the interference occurs is shifted to a short-wavelength side (blue shift) along with the increase in the angle θ. Therefore, as illustrated in FIG. 4, in a region in which a periodic structure 300 is not provided, because of the one-dimensional optical cavity, the propagating light 202 causes the short-wavelength shift (blue shift) when the viewing angle θ relative to the direction normal to the substrate becomes larger.

On the other hand, in the region in which the periodic structure 300 is provided, the guided-wave light 203 is extracted as the diffraction light 204 to the outside of the light-emitting device by the periodic structure 300. Hereinafter, the periodic structure 300 for converting the diffraction light 204 into the negative diffraction light will be discussed.

As illustrated in FIG. 2, in this Embodiment 1, the EL region 302 includes the region in which the periodic structure 300 is provided and the region in which the periodic structure 300 is not provided. Assume that two primitive lattice vectors for specifying the period of the periodic structure 300 are represented by $a_1$ and $a_2$. Assume that primitive reciprocal lattice vectors satisfying the relationship of Expression 4 with respect to the primitive lattice vectors $a_1$ and $a_2$ are represented by $b_1$ and $b_2$. The example of FIG. 2 illustrates the layered structure in which the region in which the periodic structure 300 is provided and the region in which the periodic structure 300 is not provided are arranged at a larger period. Two primitive lattice vectors for specifying the larger period are expressed by $A_1$ and $A_2$. A distance (half distance) with which the intensity of the guided-wave light 203 is reduced by half because of attenuation is approximately 10 µm. Therefore, in order that light which has been emitted from the region in which the periodic structure 300 is not provided and has reached the periodic structure 300 is extracted to the outside of the light-emitting device, the size of each of the two primitive lattice vectors $A_1$ and $A_2$ is desirably equal to or less than 10 µm. The example of FIG. 2 illustrates the structure in which the periodic structure 300 has a four-fold symmetry in order to obtain the same viewing angle characteristic when viewed from the upper, lower, right, and left sides.

$$a_i \cdot b_j = 2\pi\delta_{ij}, (i,j=1,2) \quad \text{(Expression 4)}$$

Here, the emission peak wavelength of the emission layer of the organic layer 101 is represented by λ and the wave number is expressed by "k=2π/λ". Further, the refractive index of the emission layer is represented by "n", the refractive index of a medium (generally air) located on the light extraction side is represented by $n_{ext}$, and it is assumed that a relationship of $n > n_{ext}$ is satisfied.

Moreover, the propagation coefficient in the direction parallel to the substrate 100 with respect to the guided-wave light 203 propagating through the optical waveguide 301 is represented by β, and the effective refractive index $n_{eff}$ and the effective absorption coefficient $k_{eff}$ with respect to the guided-wave light 203 are defined by Expression 5. The effective refractive index $n_{eff}$ satisfies a condition of $n_{ext} < n_{eff} < n$.

$$\beta = (n_{eff} + iK_{eff})k \quad \text{(Expression 5)}$$

In this case, a diffraction condition is obtained by Expression 6 based on a phase matching condition in the horizontal direction under the condition of $n_{ext} < n_{eff} < n$ on the assumption that two integers $m_1$ and $m_2$ represents diffraction orders and θ denotes the diffraction angle relative to the direction normal to the substrate.

$$n_{eff} - n_{ext}\sin\theta = \frac{\lambda}{2\pi}|m_1 b_1 + m_2 b_2| \quad \text{(Expression 6)}$$

In FIG. 5, the condition in which the diffraction light 204 becomes the negative diffraction light is substantially obtained by Expression 7 based on the diffraction condition of Expression 6. Assume that, when λ represents the peak wavelength of the spectrum of light to be extracted to the outside though the periodic structure, the two integers $m_1$ and $m_2$ represent the diffraction orders, and θ represents the diffraction angle relative to the direction normal to the substrate, the condition of $n_{ext} < n_{eff} < n$ is satisfied.

The term "negative diffraction" herein employed refers to forming an angle which is larger than 90° and smaller than 180° relative to a guided-wave direction of the guided-wave light 203. The light extracted to the outside through the periodic structure desirably has a maximum intensity or a maximum luminance in a direction that forms an angle which is larger than 90° and smaller than 180° relative to a guided-wave direction of the optical waveguide.

$$n_{ext} < \frac{\lambda}{2\pi}|m_1 b_1 + m_2 b_2| < n + n_{ext} \quad \text{(Expression 7)}$$

In a case of a square grating, when the period is represented by "a", the primitive lattice vectors are obtained by Expression 8 and the primitive reciprocal lattice vectors are obtained by Expression 9.

$$a_1 = \begin{pmatrix} a \\ 0 \end{pmatrix}, a_2 = \begin{pmatrix} 0 \\ a \end{pmatrix} \quad \text{(Expression 8)}$$

$$b_1 = \frac{2\pi}{a}\begin{pmatrix} 1 \\ 0 \end{pmatrix}, b_2 = \frac{2\pi}{a}\begin{pmatrix} 0 \\ 1 \end{pmatrix} \quad \text{(Expression 9)}$$

In this case, the diffraction condition of Expression 6 is expressed by Expression 10. Further, the condition for causing the negative diffraction as expressed by Expression 7 is expressed by Expression 11.

$$n_{\textit{eff}} - n_{ext}\sin\theta = \frac{\sqrt{m_1^2 + m_2^2}}{a}\lambda \quad \text{(Expression 10)}$$

$$\frac{\sqrt{m_1^2 + m_2^2}}{n + n_{ext}}\lambda < a < \frac{\sqrt{m_1^2 + m_2^2}}{n_{ext}}\lambda \quad \text{(Expression 11)}$$

Here, attention is focused on any one of one-dimensional directions and it is assumed that $m_2=0$ (or $m_1=0$) and $|m_1|=m>0$ (or $|m_2|=m>0$). In this case, the diffraction condition of Expression 10 is simplified to become Expression 12. Expression 11 expressing a condition for causing the negative diffraction is simplified to become Expression 13.

$$n_{\textit{eff}} - n_{ext}\sin\theta = m\frac{\lambda}{a} \quad \text{(Expression 12)}$$

$$\frac{m}{n + n_{ext}}\lambda < a < \frac{m}{n_{ext}}\lambda \quad \text{(Expression 13)}$$

In order to enable a light emission pattern, efficiency, and chromaticity of the OLED device to be controlled, it is desirable to generate only primary negative diffraction light and to reduce the number of modes of the guided-wave light. The conditional expression in the case where only primary negative diffraction light is generated is substantially obtained by Expression 14. In the case of the OLED device, the refractive index "n" of the emission layer is approximately 1.6 to 2.0 and the refractive index $n_{ext}$ of the medium located on the light extraction side is 1.0. Therefore, when only the primary negative diffraction light is mainly used, the period "a" of the periodic structure 300 is desirably substantially 0.33 times to 1.0 times the emission peak wavelength λ. Since the visible light wavelength region is 380 nm to 780 nm, the period "a" of the periodic structure 300 is desirably equal to or more than 125 nm and equal to or less than 780 nm. In order to reduce the number of modes of the guided-wave light in view of the enhancement condition of the multiple interference as expressed by Expression 3, the optical path length between the first reflective surface and the second reflective surface is desirably substantially 0.375 times to 1.375 times the emission peak wavelength λ. In the case of the OLED device, since the refractive index "n" between the first reflective surface and the second reflective surface is approximately 1.5 to 2.0, the film thickness between the first reflective surface and the second reflective surface is desirably equal to or more than 70 nm and equal to or less than 715 nm.

$$\frac{\lambda}{n + n_{ext}} < a < \frac{\lambda}{n_{ext}} \quad \text{(Expression 14)}$$

When the diffraction condition of Expression 12 is differentiated with respect to the wavelength λ and an approximation of $dn_{\textit{eff}}/d\lambda=0$ is made on the assumption that the dependency of the effective refractive index $n_{\textit{eff}}$ on wavelength is small, Expression 15 is obtained.

$$\frac{d\theta}{d\lambda} = -\frac{1}{n_{\textit{eff}}\cos\theta}\frac{m}{a} \quad \text{(Expression 15)}$$

When the negative diffraction light is generated, $\theta<0$ is satisfied. Therefore, Expression 15 becomes Expression 16 because the absolute value $|\theta|=-\theta$. Expression 16 indicates that, when the negative diffraction occurs, the absolute value $|\theta|$ of the diffraction angle becomes larger as the wavelength λ increases. Thus, the negative diffraction light causes long-wavelength shift (red shift) when the viewing angle increases.

$$\frac{d|\theta|}{d\lambda} = \frac{1}{n_{\textit{eff}}\cos|\theta|}\frac{m}{a} \quad \text{(Expression 16)}$$

Therefore, when the negative diffraction light is generated, the emission efficiency can be improved. In addition, a change in viewing angle of emission color can be suppressed by the short-wavelength shift (blue shift) of the propagating light resulting from the optical cavity and the long-wavelength shift (red shift) of the negative diffraction light resulting from the periodic structure.

Evaluation examples and comparative examples which are based on numerical calculation will be described below. A finite difference time domain (FDTD) method was used for numerical calculation of electromagnetic waves in view of a cross section of the organic light-emitting apparatus. The calculation was performed in a wavelength range (λ) of 380 nm to 780 nm at intervals of 5 nm. The calculation was performed with the electromagnetic wave mode being set to TE and TM modes.

Comparative Example 1

FIG. 4 illustrates a comparative example in which a periodic structure for generating negative diffraction light is not provided. A reflective electrode 102 (Ag alloy; 200 nm in thickness) is stacked on a substrate 100. A transparent electrode 103B (20 nm in thickness) is stacked on the reflective electrode 102. A hole-transport layer 106 (155 nm in thickness), a G-emission layer 125 (30 nm in thickness), an electron-transport layer 107 (10 nm in thickness), and an electron-injection layer 109 (30 nm in thickness) are stacked. In addition, a translucent metal electrode 104 (Ag alloy; 24 nm in thickness) is stacked.

Figure 9:
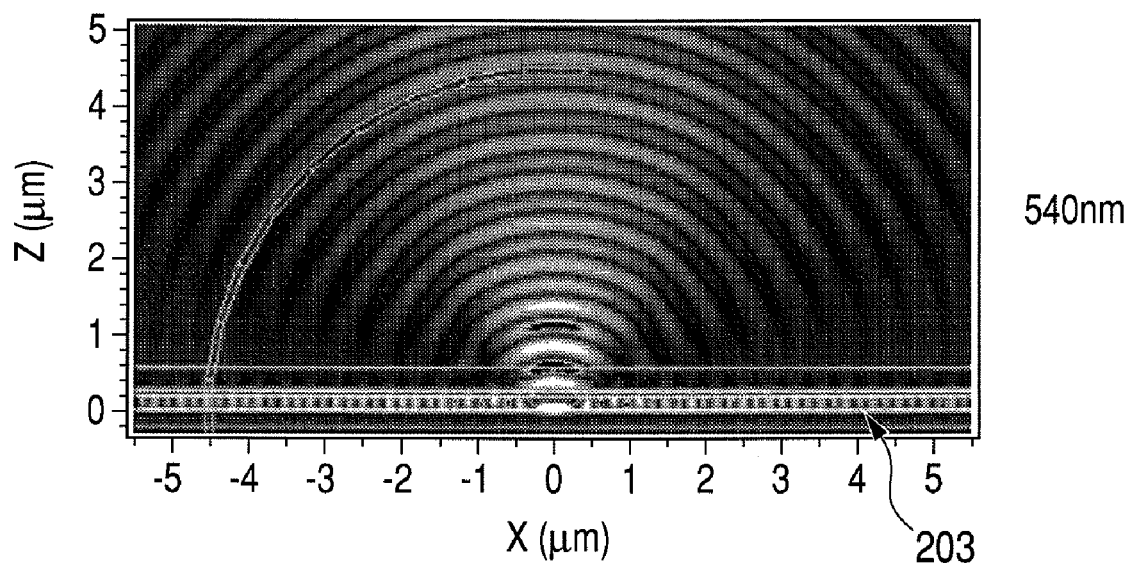
FIG. 9 illustrates a result (Contour Map of Ey at cT=29.997 μm) obtained by numerical calculation at an emission wavelength of 540 nm in the organic light-emitting apparatus including the reflective surfaces having no periodic structure.

FIG. 9 illustrates a result obtained by numerical calculation at a wavelength λ of 540 nm in a TE mode. It can be seen from the figure that most of light emitted from the light emission point is confined as guided-wave light 203 inside the light-emitting device.

Here, the effective refractive index $n_{\textit{eff}}$ with respect to the guided-wave light 203 was approximately 1.62. The refractive index "n" of the G-emission layer 125 at the wavelength λ of 540 nm is approximately 1.94. The refractive index $n_{ext}$ of air located on the light extraction side is 1.0. Therefore, the condition of $n_{ext} < n_{\textit{eff}} < n$ is satisfied.

Evaluation Example 1

In an evaluation example of the present invention, numerical calculation was performed for a case where as illustrated in FIG. 1, the periodic structure 300 was present at the interface between the reflective electrode 102 and the transparent electrode 103B located on the reflective electrode 102. The period "a" of the periodic structure 300 is 250 nm, the depth thereof is 40 nm, and the width thereof is 140 nm. The region in which the periodic structure 300 is provided and the flat region are alternatively arranged at every ten periods. The film thickness structure except the periodic structure 300 is the same as Comparative Example 1.

Here, in order to improve the flatness of an interface between the anode and the organic layer 101, the transparent electrode 103B located on the reflective electrode 102 may be thickened to a thickness of approximately 80 nm. With the improvement, in order to adjust the optical length, the hole-transport layer 106 may be thinned to a thickness of approximately 85 nm.

Figure 11:
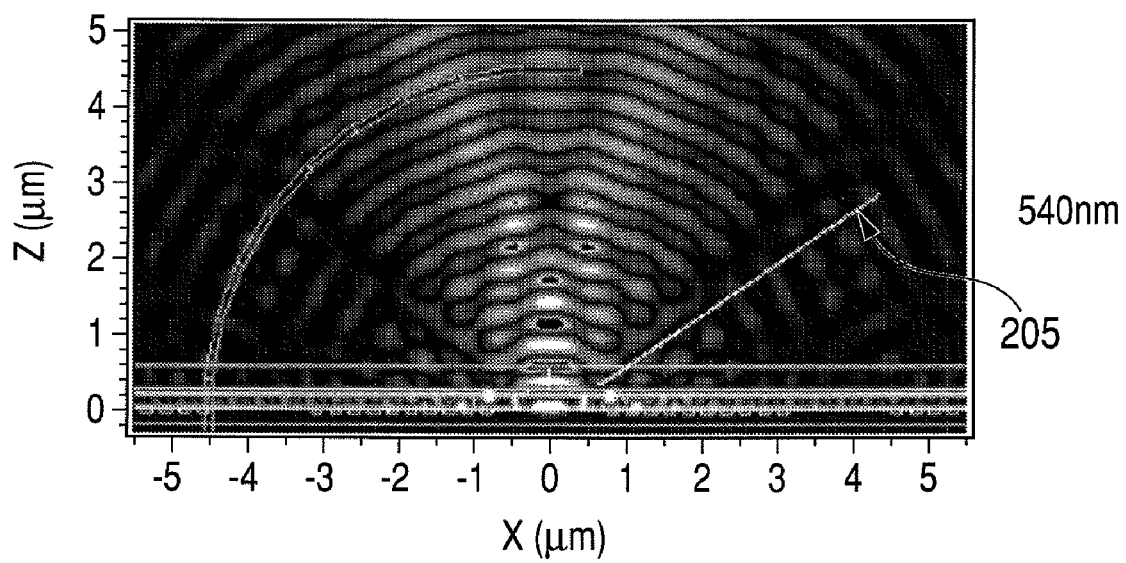
FIG. 11 illustrates a result (Contour Map of Ey at cT=29.997 µm) obtained by numerical calculation at an emission wavelength of 540 nm in the organic light-emitting apparatus including the reflective surfaces with the periodic structure.

FIG. 11 illustrates a result obtained by numerical calculation at the emission wavelength $\lambda$ of 540 nm in the TE mode. It can be seen from a diffraction light wave front 205, the negative diffraction light is generated in a direction of approximately $-34°$. This matches well with an angle of approximately $-33°$ which is a diffraction angle of primary diffraction light calculated using Expression 12 indicating the phase matching condition.

Figure 10:
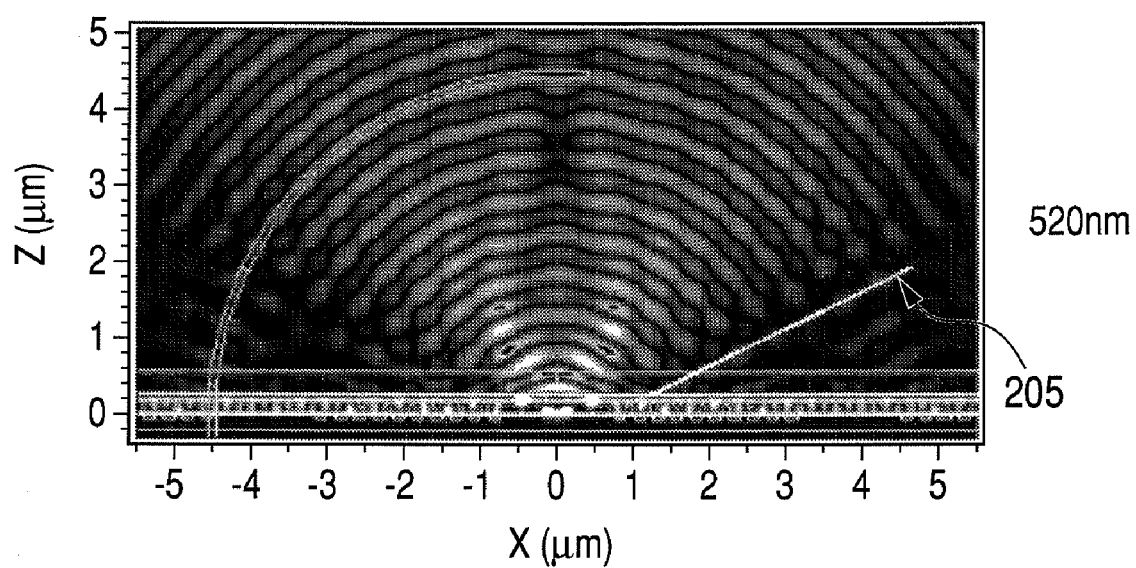
FIG. 10 illustrates a result (Contour Map of Ey at cT=29.997 µm) obtained by numerical calculation at an emission wavelength of 520 nm in the organic light-emitting apparatus including the reflective surfaces with the periodic structure.
Figure 12:
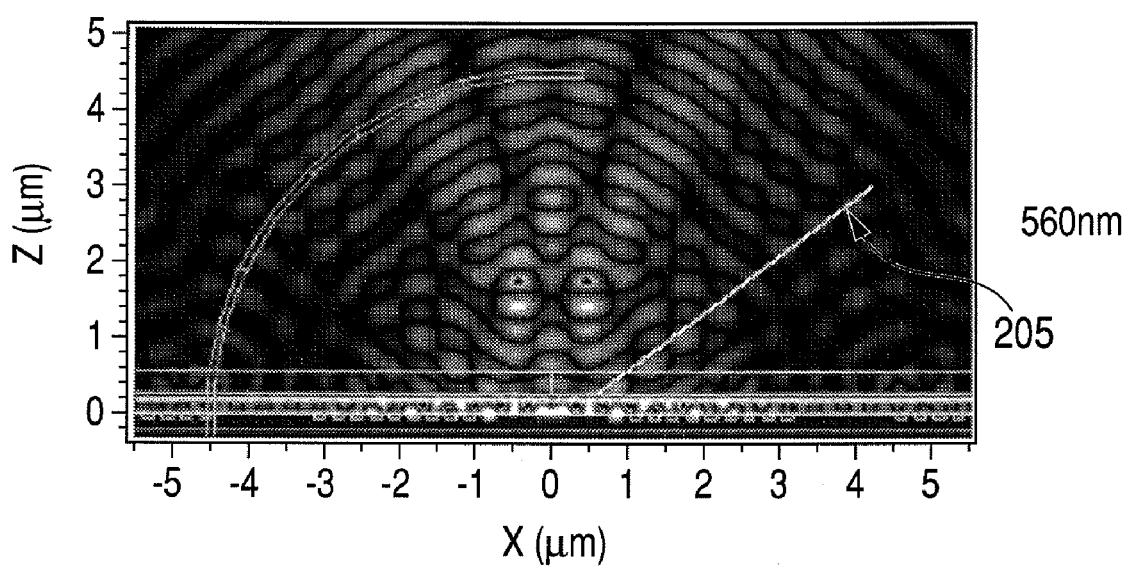
FIG. 12 illustrates a result (Contour Map of Ey at cT=29.997 µm) obtained by numerical calculation at an emission wavelength of 560 nm in the organic light-emitting apparatus including the reflective surfaces with the periodic structure.

FIGS. 10, 11, and 12 show respective results obtained by numerical calculation in the TE mode when the emission wavelength $\lambda$ was set to 520 nm, 540 nm, and 560 nm. Table 1 shows diffraction angles obtained from the diffraction light wave front 205. It can be seen as indicated by Expression 16 that the absolute value $|\theta|$ of the diffraction angle becomes larger as the emission wavelength increases.

TABLE 1

| Emission wavelength | $\lambda$ = 520 nm | $\lambda$ = 540 nm | $\lambda$ = 560 nm |
|---|---|---|---|
| Diffraction angle | $\theta = -27°$ | $\theta = -34°$ | $\theta = -37°$ |

Figure 13:
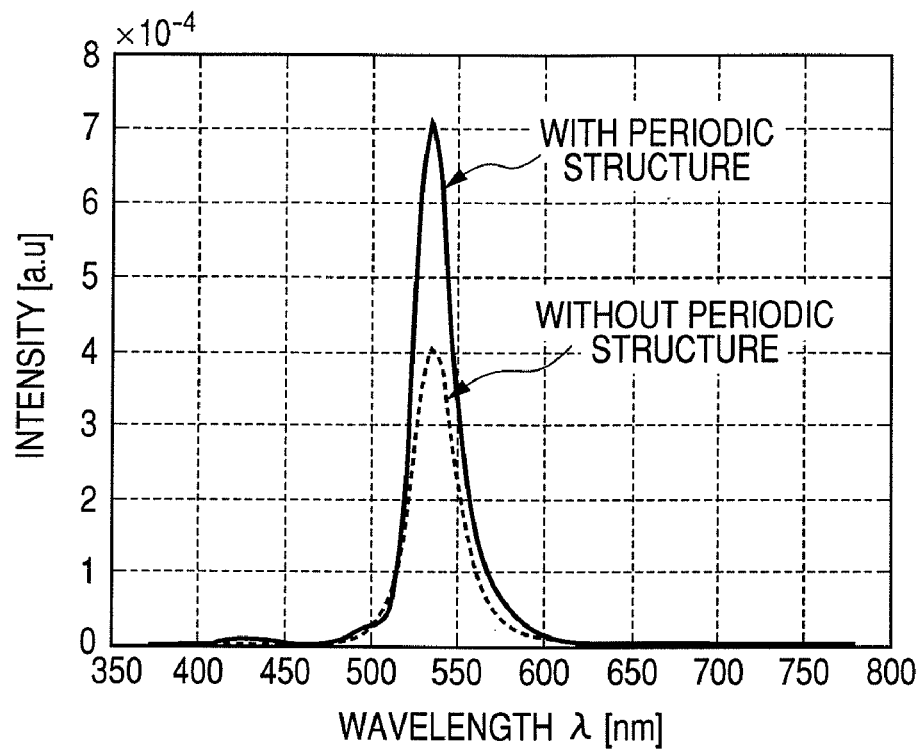
FIG. 13 illustrates a result (EL spectrum) obtained by calculation of EL spectrums on the organic light-emitting apparatus including the reflective surfaces with the periodic structure and the organic light-emitting apparatus including the reflective surfaces having no periodic structure.

FIG. 13 illustrates emission spectrums in Evaluation Example 1 (with periodic structure) and Comparative Example 1 (without periodic structure). It can be seen from the figure that the peak intensity in Evaluation Example 1 is approximately 1.8 times the peak intensity in Comparative Example 1, which indicates that emission efficiency is improved.

Figure 14:
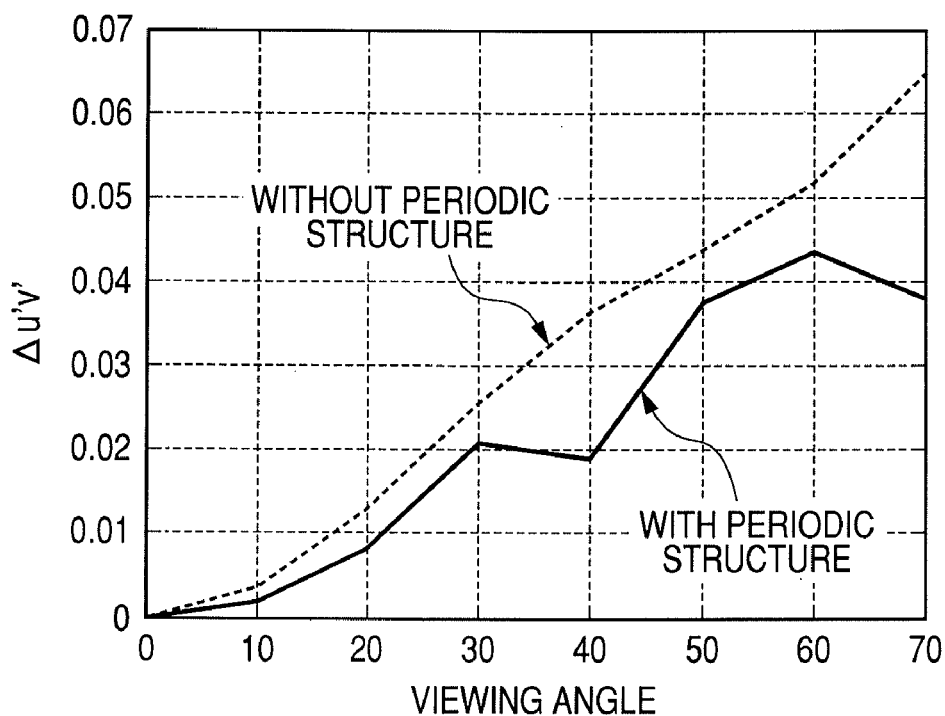
FIG. 14 illustrates a result (Δu'v') obtained by calculation of angle dependency of chromaticity change on the organic light-emitting apparatus including the reflective surfaces with the periodic structure and the organic light-emitting apparatus including the reflective surfaces having no periodic structure.

Table 2 illustrates values of CIE chromaticity change $\Delta u'v'$ of emission color with respect to viewing angle $\theta$ in Evaluation Example 1 (with periodic structure) and Comparative Example 1 (without periodic structure). FIG. 14 is a graph illustrating the values of the CIE chromaticity change $\Delta u'v'$. It can be seen from Table 2 and FIG. 14 that the CIE chromaticity change in Evaluation Example 1 is suppressed to be less than the CIE chromaticity change in Comparative Example 1 at each viewing angle. In particular, in Evaluation Example 1, the CIE chromaticity change $\Delta u'v'$ at the viewing angle equal to or smaller than 60° is suppressed to a value less than 0.05. In addition, the CIE chromaticity change $\Delta u'v'$ at the viewing angle equal to or smaller than 40° is suppressed to a value less than 0.02.

TABLE 2

| CIE chromaticity change | $\Delta u'v'$ ($\theta = 20°$) | $\Delta u'v'$ ($\theta = 40°$) | $\Delta u'v'$ ($\theta = 60°$) |
|---|---|---|---|
| Evaluation Example 1 | 0.008 | 0.019 | 0.044 |

TABLE 2-continued

| CIE chromaticity change | $\Delta u'v'$ ($\theta = 20°$) | $\Delta u'v'$ ($\theta = 40°$) | $\Delta u'v'$ ($\theta = 60°$) |
|---|---|---|---|
| Comparative Example 1 | 0.013 | 0.037 | 0.052 |

Therefore, according to the present invention, the light extraction efficiency of the light-emitting device can be improved and the viewing angle dependency of the emission color can be reduced.

The foregoing description has been made by taking, as an example, a structure in which the anode is located on the substrate side and the cathode is located on the light extraction side. However, even in a case of a structure in which the cathode is located on the substrate side, the anode is located on the light extraction side, and the hole-transport layer, the emission layer, and the electron-transport layer are stacked in the reverse order, the present invention can be carried out. Therefore, the light-emitting apparatus according to the present invention is not limited to the structure in which the anode is located on the substrate side and the cathode is located on the light extraction side.

As the organic compound for use in each of the hole-transport layer 106, the emission layer 105, the electron-transport layer 107, the hole-injection layer 108, and the electron-injection layer 109 as illustrated in FIG. 3, a low-molecular material, a polymer material, or a combination thereof is used. Therefore, the organic compound is not particularly limited. If necessary, an inorganic compound may also be used.

Figure 15:
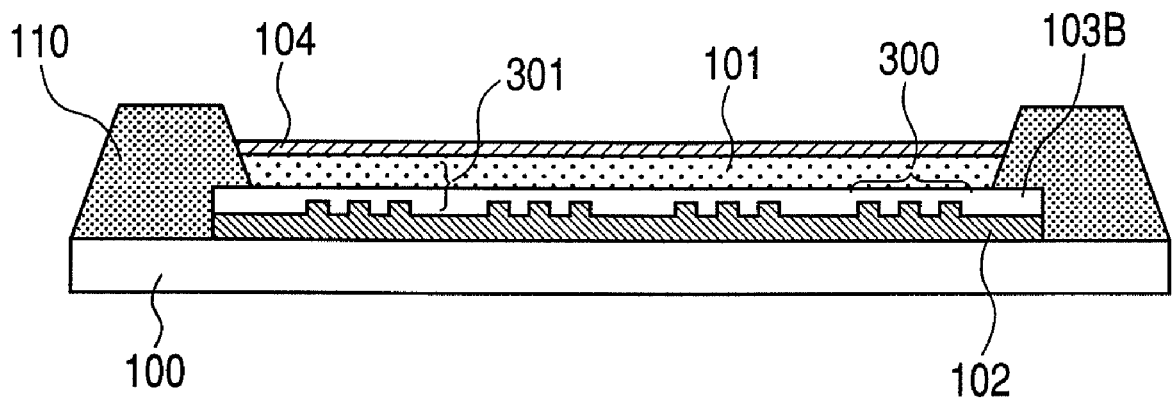
FIG. 15 is a schematic cross-sectional view illustrating an organic light-emitting apparatus including reflective surfaces with a periodic structure which protrudes upward.
Figure 40:
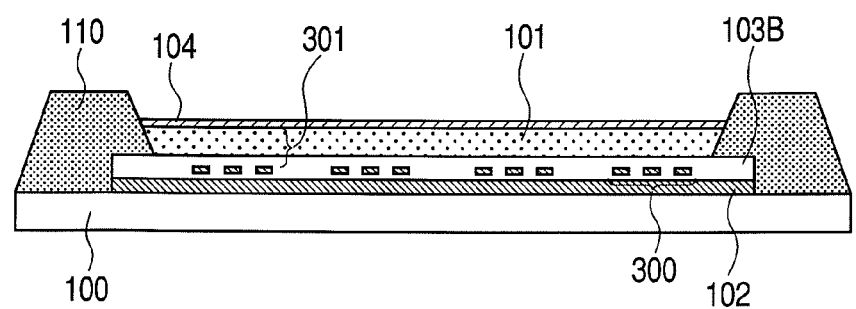
FIG. 40 is a schematic cross-sectional view illustrating an organic light-emitting apparatus which has a periodic structure provided between two reflective surfaces.

Further, the periodic structure 300 is not limited to the two-dimensional photonic crystal structure as described above, and may be a combination of one-dimensional diffraction gratings or a three-dimensional photonic crystal structure. Although a recessed photonic crystal structure is illustrated in FIG. 1, a protruding photonic crystal structure such as illustrated in FIG. 15 may also be used. Moreover, as illustrated in FIG. 40, the periodic structure may be provided at a location apart from a reflective interface.

Figure 16:
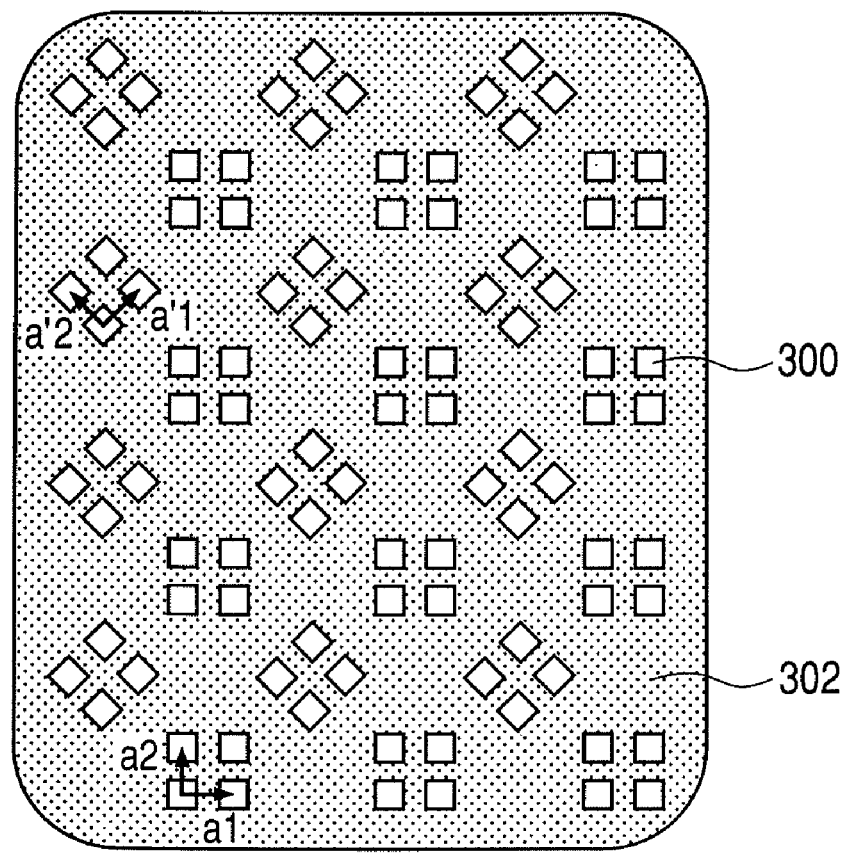
FIG. 16 is a schematic plan view illustrating an organic light-emitting apparatus including reflective surfaces with a periodic structure.

Moreover, as illustrated in FIG. 16, plural kinds of periodic structures 300 having different primitive lattice vectors may be mixed. FIG. 16 illustrates an example in which a periodic structure having primitive lattice vectors $a_1$ and $a_2$ and a periodic structure having primitive lattice vectors $a'_1$ and $a'_2$ are combined. It is to be noted that $a'_1$ denotes a vector in a $(a_1+a_2)/\sqrt{2}$ direction and $a'_2$ denotes a vector in a $(-a_1+a_2)/\sqrt{2}$ direction. In other words, periodic structure-1 having a four-fold symmetry and periodic structure-2 obtained by rotating the periodic structure-1 by 45° are combined. When the periodic structures are arranged as illustrated in FIG. 16, not only the viewing angle characteristics of the light-emitting device in the up and down direction and the right and left direction but also the viewing angle characteristics of the light-emitting device in oblique directions can be made equal to one another. similarly, when N denotes a natural number, periodic structure-1 having an N-fold symmetry and periodic structure-2 obtained by rotating the periodic structure-1 by 180°/N can be combined.

The periodic structure 300 is not necessarily completely periodic and thus may be a quasi-crystalline structure, a fractal structure, a structure whose period continuously changes, an irregular scattering structure, or a combination of a periodic structure and any one of these structures.

Figure 17:
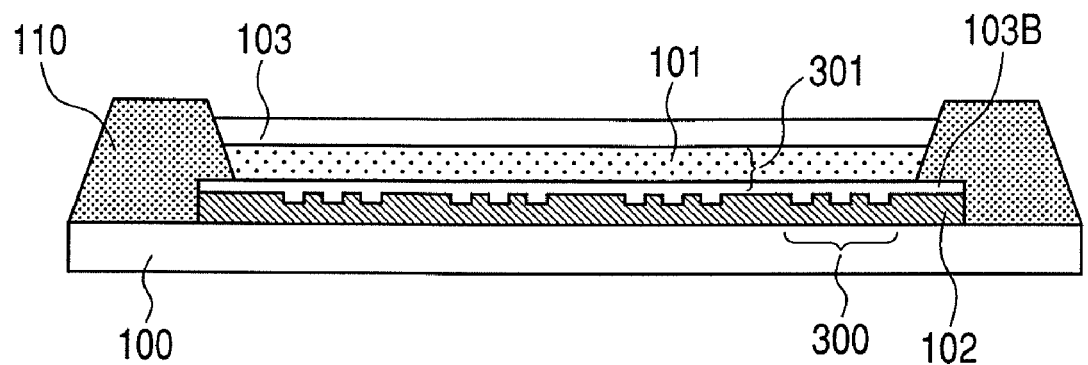
FIG. 17 is a schematic cross-sectional view illustrating the organic light-emitting apparatus including the reflective surfaces with the periodic structure.
Figure 18:
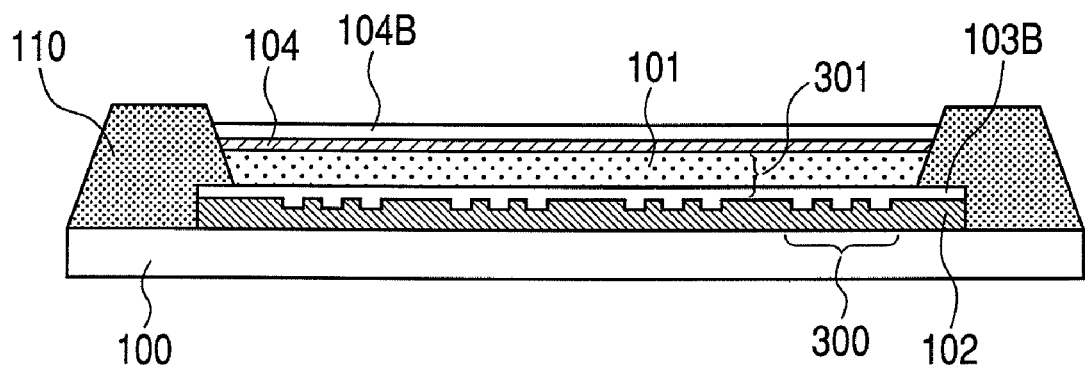
FIG. 18 is a schematic cross-sectional view illustrating an organic light-emitting apparatus which includes reflective surfaces provided with a periodic structure and is provided on a light extraction side thereof with a metal electrode, a dielectric layer, and a translucent electrode.

The above description has been made by taking, as an example, a structure in which the translucent metal electrode is provided as the electrode located on the light extraction side. However, as illustrated in FIG. 17, even in a case of a structure in which a transparent electrode (light transmission electrode) 103 is provided as the electrode located on the light extraction side, the present invention can be carried out. In this case, an interface between the transparent electrode 103 and air is used as the second reflective surface. Moreover, as illustrated in FIG. 18, a translucent metal electrode 104 and a dielectric layer 104B may be combined. Further, a multilayer interference film including any tow or more layers or all of a metal layer, a transparent electrode layer, and a dielectric layer can be also provided for one of the first reflective surface and the second reflective surface, which is located on the light extraction side.

Figure 19:
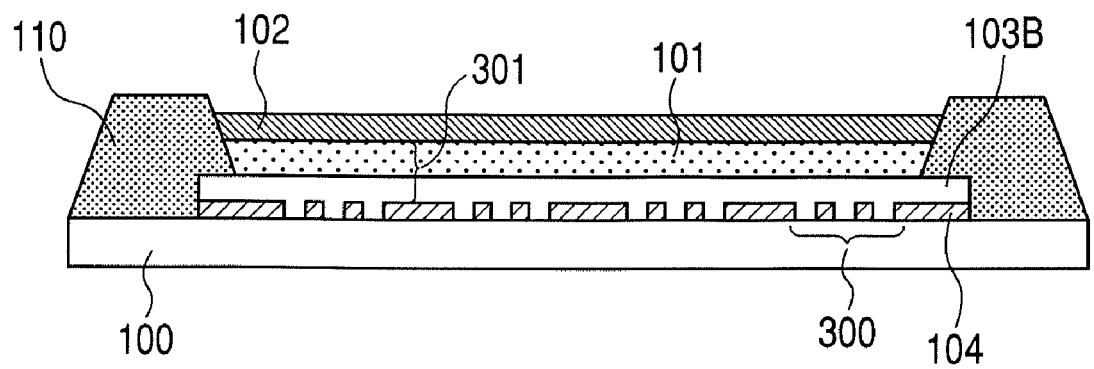
FIG. 19 is a schematic cross-sectional view illustrating a bottom-emission organic light-emitting apparatus including reflective surfaces with a periodic structure.

Even in a case of a bottom-emission structure in which the substrate side is the light extraction side, the present invention can be carried out. FIG. 19 illustrates an example in which the periodic structure is arranged in a reflective surface located on the substrate side relative to the emission layer. That is, in the bottom-emission structure, a translucent metal electrode 104 having a periodic structure 300 and a transparent electrode 103B located on the translucent electrode are formed on a substrate 100, and an organic layer 101 and a reflective electrode 102 are stacked on the transparent electrode 103B.

Further, in FIG. 1, surface plasmon is generated which propagates in the direction parallel to the substrate through an interface (metal reflective surface) between the reflective electrode 102 made of metal and the transparent electrode 103B which is deemed to be a dielectric in the visible light wavelength region and located on the reflective electrode, and which may be considered as a kind of guided-wave light. Therefore, the interface between the reflective electrode 102 and the transparent electrode 103B located on the reflective electrode can be used as an optical waveguide. When the propagation coefficient $\beta_{sp}$ of the surface plasmon is set as the propagation coefficient $\beta$ of Expression 5, the diffraction condition is expressed by Expression 6 as is the case with normal guided-wave light. The interface at which surface plasmon is generated is not limited to an interface between a metal and a transparent electrode, but also includes an interface between a metal and an organic layer or an interface between a metal and a dielectric layer.

(Embodiment 2)

Figure 20:
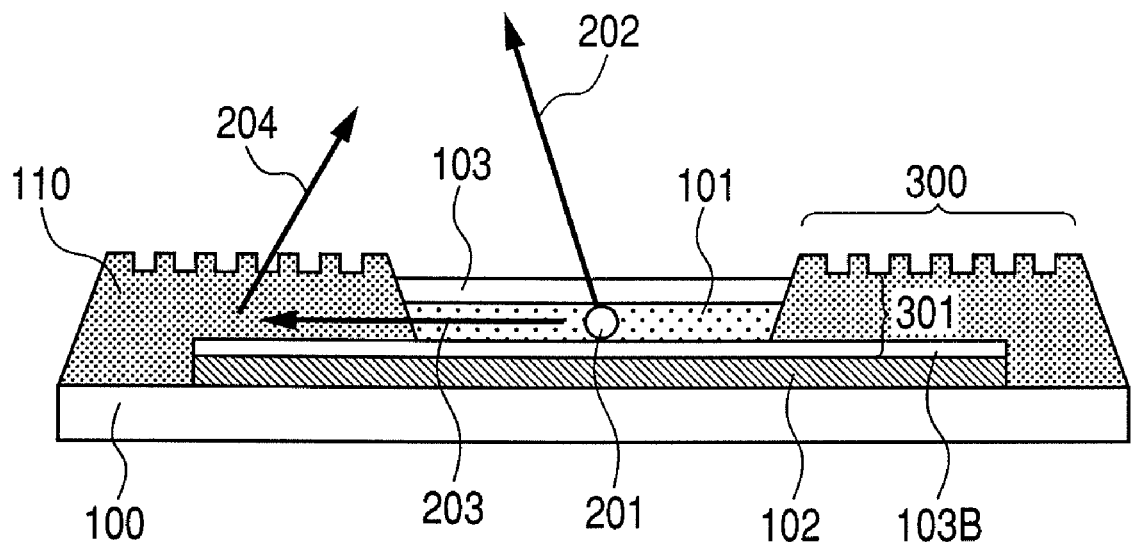
FIG. 20 is a schematic cross-sectional view illustrating an organic light-emitting apparatus which is provided on a device side surface with a periodic structure.

FIG. 20 is a schematic cross-sectional view illustrating an organic light-emitting apparatus having a cavity structure, and a periodic structure provided on a device side surface thereof. FIG. 20 illustrates the organic light-emitting apparatus. However, even in a case of an inorganic light-emitting apparatus or a QD-LED apparatus, the present invention can be carried out.

The organic light-emitting apparatus illustrated in FIG. 20 includes an OLED device (light-emitting device). In the OLED device, a reflective electrode (first electrode) 102 serving as an anode is formed on a substrate 100. A transparent electrode 103B is formed on the reflective electrode 102. A device separation film (light transmission member) 110 which is an insulating member is formed so as to cover the peripheral edge of the anode.

A periodic structure 300 is formed in a surface of the device separation film 110, which is on a side opposite to the substrate 100 side. An organic layer 101 containing one of a fluorescent organic compound and a phosphorescent organic compound is stacked on an exposed portion of the anode which is exposed through an opening portion of the device separation film 110. A transparent electrode (second electrode) 103 serving as a cathode is formed on the organic layer 101.

Figure 21:
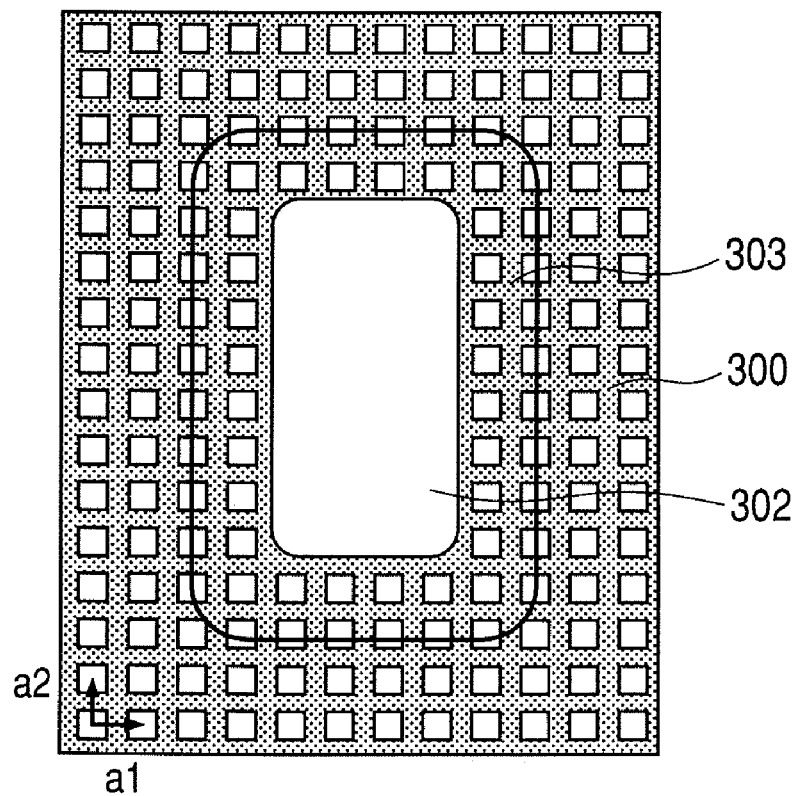
FIG. 21 is a schematic plan view illustrating the organic light-emitting apparatus which is provided on the device side surface with the periodic structure.

As illustrated in FIG. 21, the periodic structure 300 in this Embodiment 2 is a two-dimensional photonic crystal structure provided so as to surround the EL region 302. The EL region 302 illustrated in FIG. 21 corresponds to a stacked portion including the reflective electrode 102, the organic layer 101, and the transparent electrode 103 as illustrated in FIG. 1.

The optical waveguide 301 is formed between the bottom of the periodic structure 300 and the reflective electrode 102. The optical waveguide 301 is of the planar type and formed by adjusting an etching depth of the periodic structure 300.

As illustrated in FIG. 3, the organic layer 101 normally has a structure in which the hole-transport layer 106, the emission layer 105 (R-emission layer 115, G-emission layer 125, and B-emission layer 135), and the electron-transport layer 107 are stacked. The emission layer 105 contains one of a fluorescent organic compound and a phosphorescent organic compound, which corresponds to an emission color. If necessary, a hole-injection layer 108 may be interposed between the anode and the hole-transport layer 106, and an electron-injection layer 109 may be interposed between the cathode and the electron-transport layer 107.

When a voltage is applied to the OLED device, holes are injected from the anode into the organic layer 101 and electrons are injected from the cathode into the organic layer 101. The injected holes and electrons form excitons in the emission layers 105. When the excitons recombine, light (spontaneous emission light) is emitted from the emission layer 105. In the structural example of the OLED device illustrated in FIG. 20, the transparent electrode 103 side relative to the light emission point 201 is a light extraction side.

In the structural example illustrated in FIG. 20, the reflective electrode 102 and an interface between the transparent electrode 103 and air which sandwich the organic layer 101 are used as the first reflective surface and the second reflective surface, respectively, thereby providing an optical cavity having a structure which is one-dimensional in the direction perpendicular to the substrate. The transparent electrode 103 side relative to the light emission point 201 is the light extraction side. The reflective electrode 102 side relative to the light emission point 201 is the reflective surface side. The optical cavity also serves as a planar optical waveguide in the direction parallel to the substrate and is coupled to the optical waveguide 301 formed in the device separation film 110.

Figure 22:
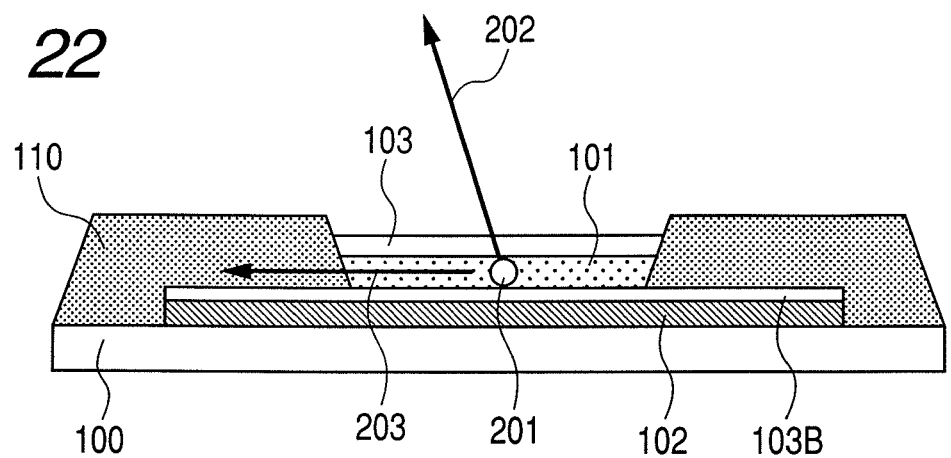
FIG. 22 is a schematic cross-sectional view illustrating an organic light-emitting apparatus which is not provided with a periodic structure on a device side surface thereof.

Light emitted from the light emission point 201 is divided into the propagating light 202 traveling to the light extraction side and the guided-wave light 203 traveling through the optical waveguide 301 in the direction parallel to the substrate. The guided-wave light 203 is extracted as the diffraction light 204 from the light extraction side to the outside of the light-emitting device by the periodic structure 300. Therefore, unlike the case where the periodic structure 300 is not provided and thus the guided-wave light 203 cannot be extracted to the outside, as illustrated in FIG. 22, the ratio of light which is extracted to the outside of the light-emitting device (light extraction efficiency) can be increased.

As is the case with Embodiment 1, the period of the periodic structure 300 is set such that the negative diffraction light is produced from the guided-wave light to be extracted to the outside.

Figure 23:
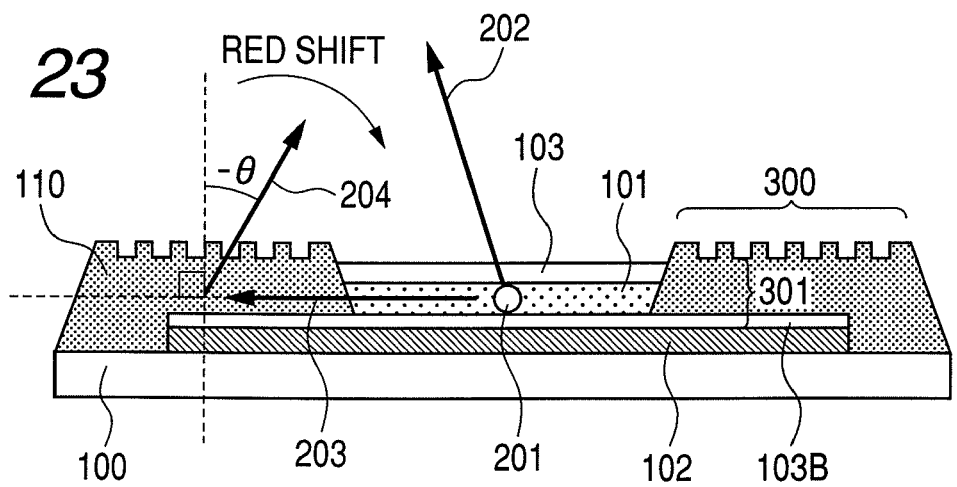
FIG. 23 is a schematic view illustrating angle dependency of diffraction light in a negative-angle direction in the organic light-emitting apparatus which is provided on the device side surface with the periodic structure.
Figure 24:
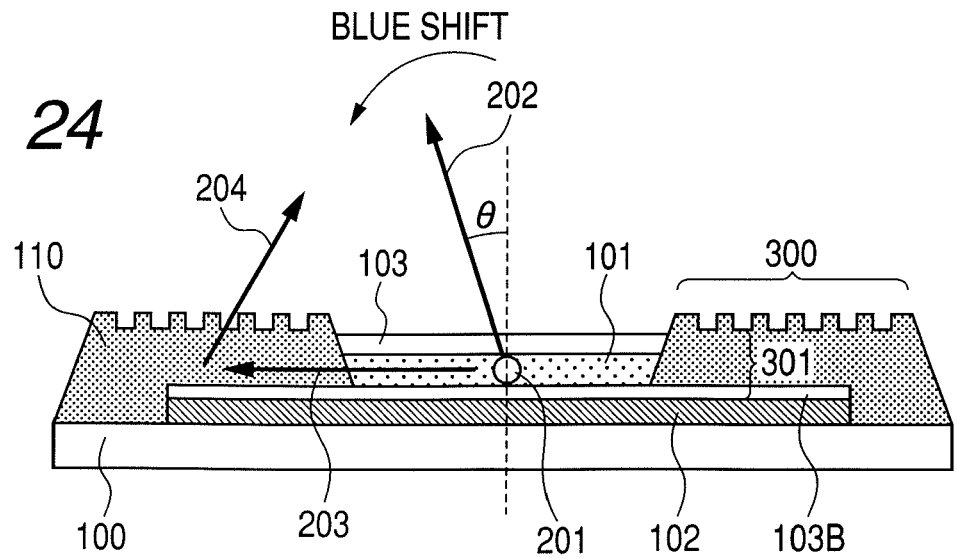
FIG. 24 is a schematic view illustrating angle dependency of an optical cavity in the organic light-emitting apparatus which is provided on the device side surface with the periodic structure.

As illustrated in FIG. 23, in a region in which the periodic structure 300 is provided, light emitted as the negative diffraction light to the outside of the light-emitting device causes long-wavelength shift (red shift) with increase of the viewing angle. On the other hand, as illustrated in FIG. 6, the opening portion of the device separation film 110, the propagating light 202 emitted to the outside of the light-emitting device causes short-wavelength shift (blue shift) with increase of the viewing angle, because of the optical cavity. Therefore, when the two effects are canceled out with each other, a change in the viewing angle of the light-emitting device can be suppressed.

Therefore, according to the present invention, the light extraction efficiency of the light-emitting device can be improved and the viewing angle dependency of the emission color can be suppressed. The detailed description of Expressions 1 to 16 is the same as that for Embodiment 1.

Evaluation examples and comparative examples which are based on numerical calculation will be described below. A finite difference time domain (FDTD) method was used for numerical calculation of electromagnetic waves in consideration of a cross section of the organic light-emitting apparatus. The calculation was performed in a wavelength range ($\lambda$) of 380 nm to 780 nm at intervals of 5 nm. The calculation was performed with the electromagnetic wave mode being set to TE and TM modes.

Comparative Example 2

FIG. 20 illustrates a comparative example in which the periodic structure is not provided in the device separation film 110 located on the side surface of the light-emitting device. The reflective electrode 102 (Ag alloy; 200 nm in thickness) is stacked on the substrate 100. The transparent electrode 103B (20 nm in thickness) is stacked on the reflective electrode 102. The hole-transport layer 106 (20 nm in thickness), the B-emission layer 135 (20 nm in thickness), the electron-transport layer 107 (10 nm in thickness), and the electron-injection layer 109 (20 nm in thickness) are stacked. In addition, the transparent electrode 103 (60 nm in thickness) is stacked.

Figure 25:
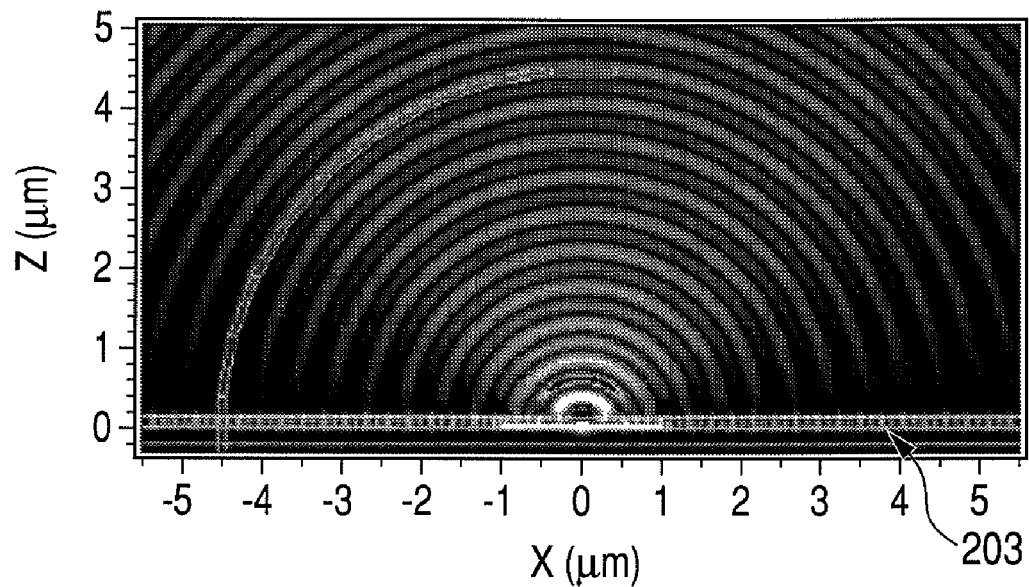
FIG. 25 illustrates a result (Contour Map of Ey at cT=29.997 µm) obtained by numerical calculation at an emission wavelength of 460 nm in the organic light-emitting apparatus which is provided on the device side surface with the periodic structure.

FIG. 25 illustrates a result obtained by numerical calculation at a wavelength $\lambda$ of 460 nm in the TE mode. It can be seen from the figure, most of light emitted from the light emission point is confined as the guided-wave light 203 inside the light-emitting device.

The effective refractive index $n_{eff}$ with respect to the guided-wave light 203 was approximately 1.65. The refractive index "n" of the B-emission layer 135 at the wavelength $\lambda$ of 460 nm is approximately 1.98. The refractive index $n_{ext}$ of air located on the light extraction side is 1.0. Therefore, the condition of $n_{ext}<n_{eff}<n$ is satisfied.

Evaluation Example 2

In an evaluation example of the present invention, numerical calculation was performed for the case where the periodic structure 300 was provided in the device separation film 110 located on the side surface of the light-emitting device illustrated in FIG. 20. The period "a" of the periodic structure 300 is 230 nm, the height thereof is 115 nm, and the width thereof is 77 nm. The thickness structure except the periodic structure 300 is the same as Comparative Example 2.

Figure 27:
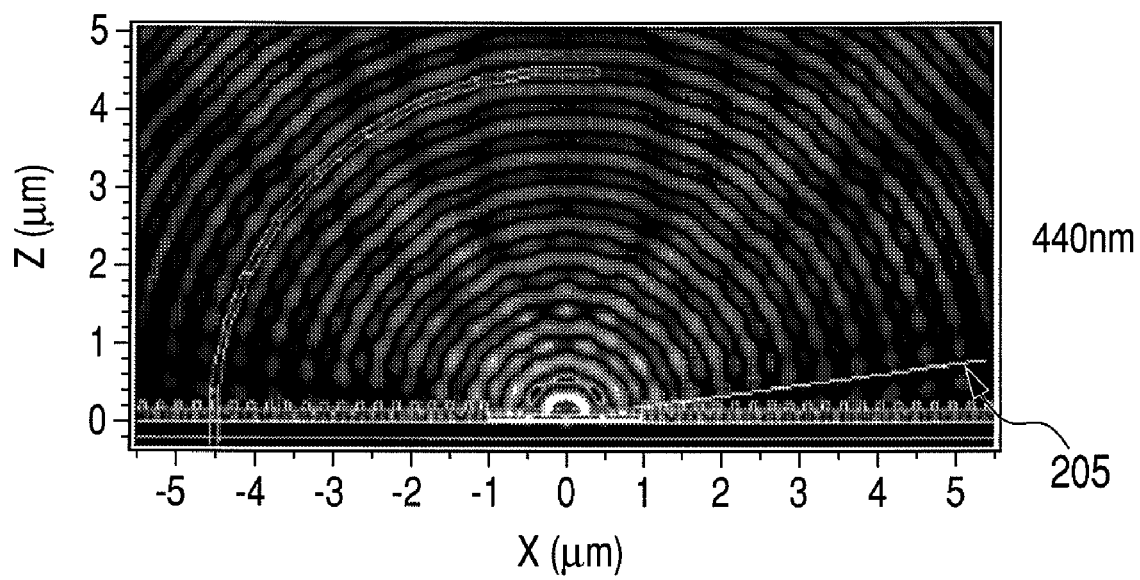
FIG. 27 illustrates a result (Contour Map of Ey at cT=29.997 µm) obtained by numerical calculation at an emission wavelength of 460 nm in the organic light-emitting apparatus which is provided on the device side surface with the periodic structure.

FIG. 27 illustrates a result obtained by numerical calculation at the emission wavelength $\lambda$ of 460 nm in the TE mode. It can be seen from the diffraction light wave front 205, the negative diffraction light is generated in a direction of approximately $-18°$. This angle matches well with an angle of approximately $-20°$ which is a diffraction angle of primary diffraction light calculated by Expression 12 indicating the phase matching condition.

Figure 26:
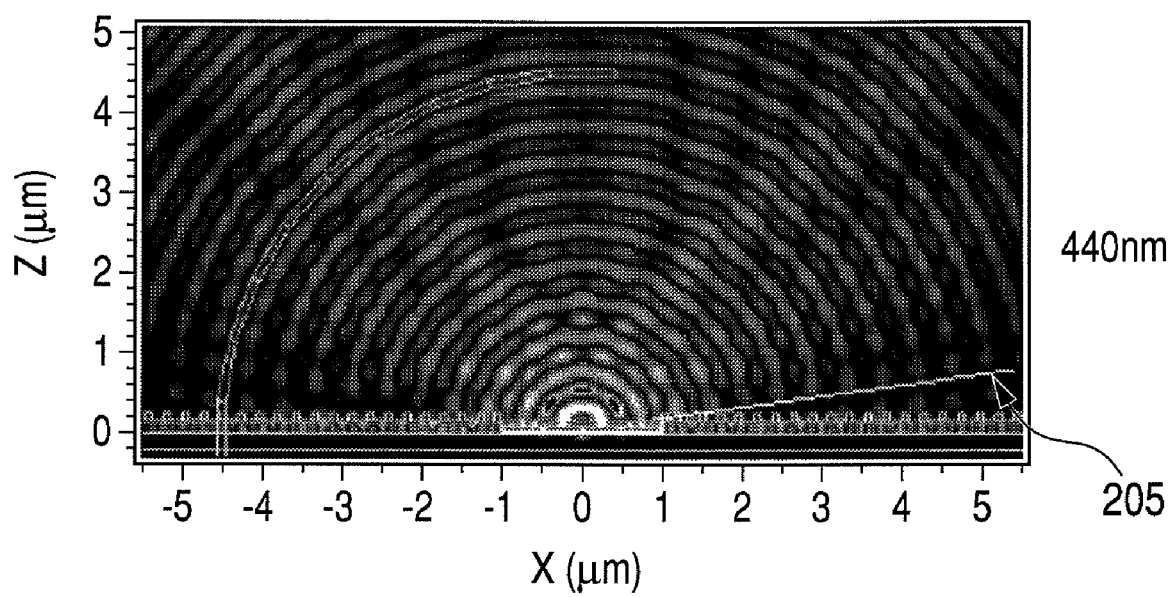
FIG. 26 illustrates a result (Contour Map of Ey at cT=29.997 µm) obtained by numerical calculation at an emission wavelength of 440 nm in the organic light-emitting apparatus which is provided on the device side surface with the periodic structure.
Figure 28:
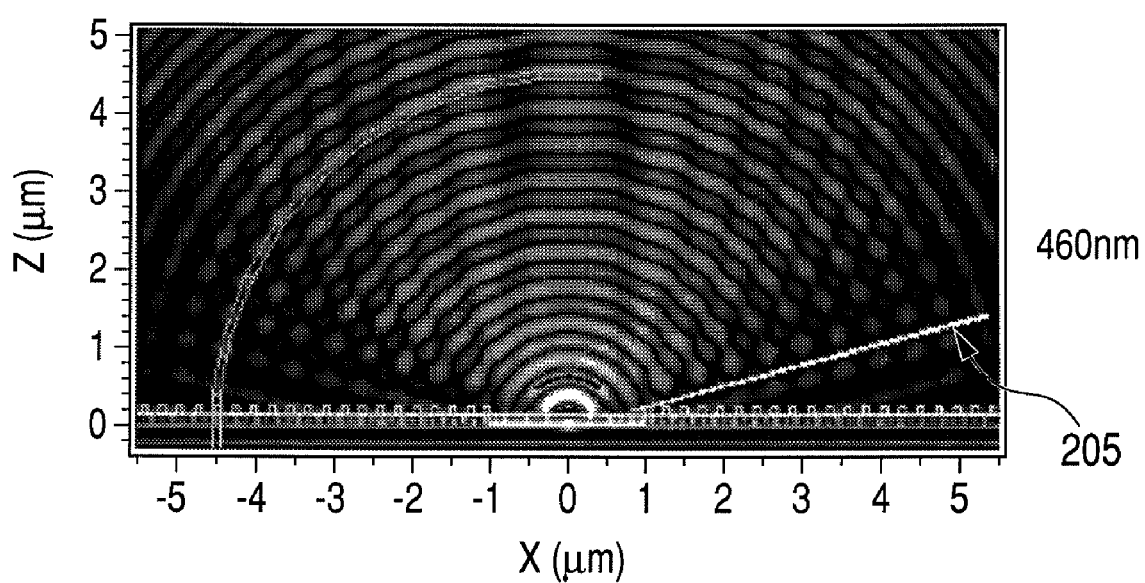
FIG. 28 illustrates a result (Contour Map of Ey at cT=29.997 µm) obtained by numerical calculation at an emission wavelength of 480 nm in the organic light-emitting apparatus which is provided on the device side surface with the periodic structure.

FIGS. 26, 27, and 28 illustrate respective results obtained by numerical calculation in the TE mode when the emission wavelength $\lambda$ was set to 440 nm, 460 nm, and 480 nm. Table 3 illustrates diffraction angles obtained from the diffraction light wave front 205. It can be seen as expressed by Expression 16 that the absolute value $|\theta|$ of the diffraction angle becomes larger as the emission wavelength increases.

TABLE 3

| Emission wavelength | $\lambda$ = 440 nm | $\lambda$ = 460 nm | $\lambda$ = 480 nm |
| --- | --- | --- | --- |
| Diffraction angle | $\theta = -11°$ | $\theta = -18°$ | $\theta = -23°$ |

Figure 29:
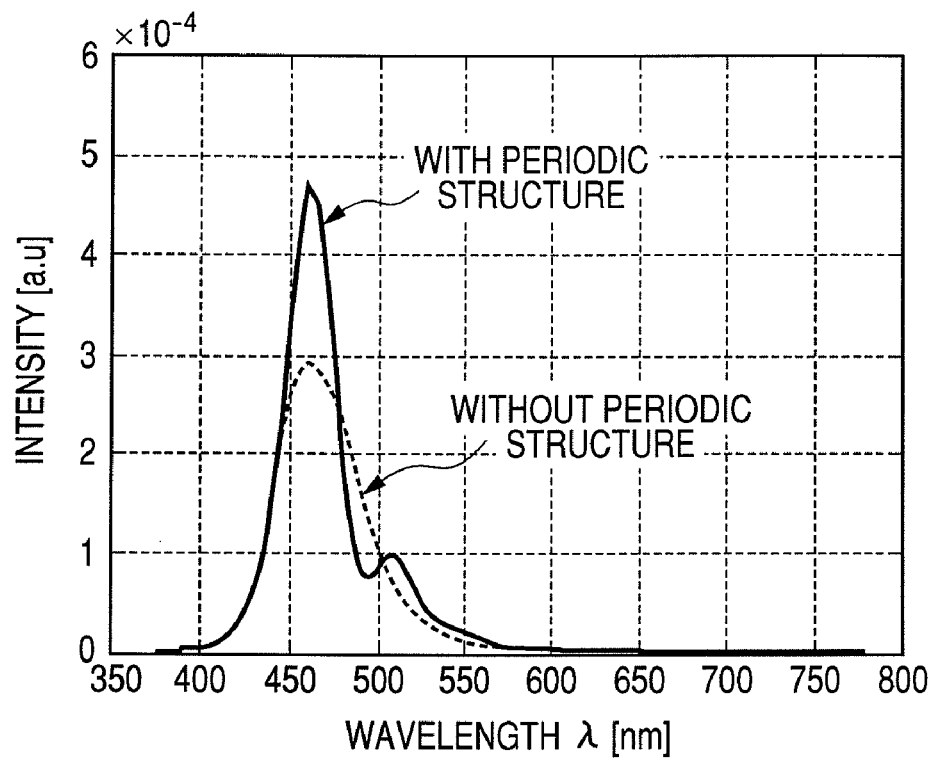
FIG. 29 illustrates a result (EL spectrum) obtained by calculation of EL spectrums on the organic light-emitting apparatus which is provided on the device side surface with the periodic structure and the organic light-emitting apparatus which is not provided on the device side surface with a periodic structure.

FIG. 29 illustrates emission spectrums in Evaluation Example 2 (with periodic structure) and Comparative Example 2 (without periodic structure). It can be seen from FIG. 29 that the peak intensity in Evaluation Example 2 is approximately 1.6 times the peak intensity in Comparative Example 2, and therefore that the emission efficiency is improved.

Figure 30:
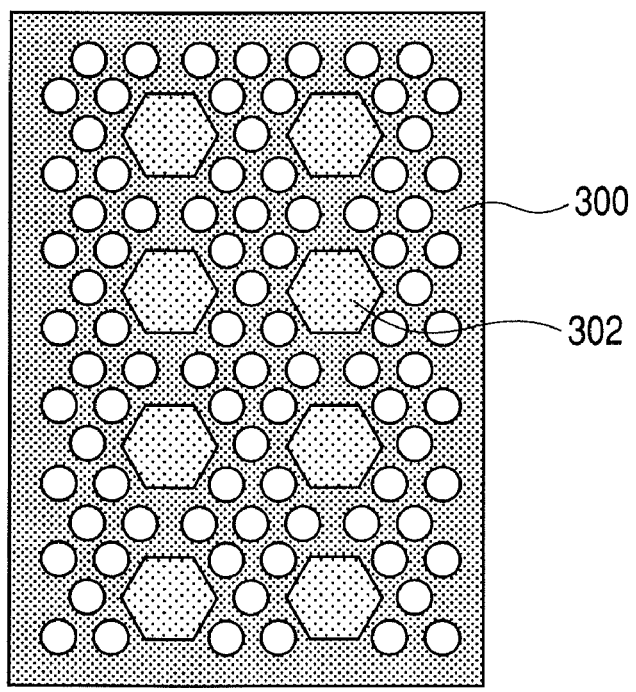
FIG. 30 is a schematic plan view illustrating an organic light-emitting apparatus which is provided on a device side surface with a periodic structure.

When the periodic structure 300 is provided in the device separation film 110 as in this Embodiment 2, light which can be extracted as the diffraction light 204 to the outside is limited to light emitted in a region within approximately 10 μm from a boundary between the device separation film and the organic layer because of attenuation of the guided-wave light 203. Therefore, in FIG. 21, an enlarged range of the diffraction light region 303 is approximately 10 μm from the boundary. Accordingly, when the area of the EL region 302 is very large, the peripheral portion hardly contributes to the improvement in the light extraction efficiency. In contrast to this, when a high definition of approximately 150 ppi to 300 ppi is realized to obtain a subpixel size of one hundred and several tens μm square to several tend μm square, the contribution of the peripheral portion to the improvement in the light extraction efficiency becomes large, whereby the emission efficiency can be improved. Moreover, as illustrated in FIG. 30, a plurality of EL regions 302 may be provided for one subpixel to increase the contribution of the peripheral portion, thereby improving the emission efficiency.

Figure 31:
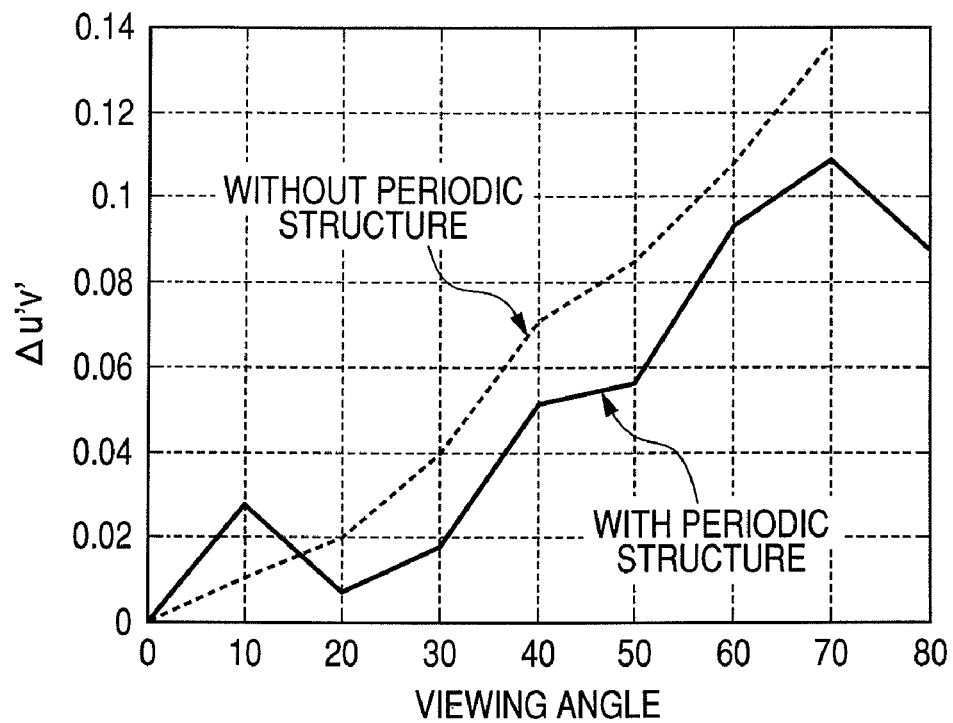
FIG. 31 illustrates a result (Δu'v') obtained by calculation of angle dependency of chromaticity change on the organic light-emitting apparatus which is provided on the device side surface with the periodic structure and the organic light-emitting apparatus which is not provided on the device side surface with the periodic structure.

Table 4 shows values of a CIE chromaticity change $\Delta u'v'$ of the emission color for the viewing angle $\theta$ in Evaluation Example 2 (with periodic structure) and Comparative Example 2 (without periodic structure). FIG. 31 is a graph illustrating the values of the CIE chromaticity change $\Delta u'v'$. It can be seen from Table 4 and FIG. 31 that the CIE chromaticity change in Evaluation Example 2 is suppressed to be smaller than the CIE chromaticity change in Comparative Example 2 at each viewing angle.

TABLE 4

| CIE chromaticity change | $\Delta u' v'$ ($\theta = 20°$) | $\Delta u' v'$ ($\theta = 40°$) | $\Delta u' v'$ ($\theta = 60°$) |
| --- | --- | --- | --- |
| Evaluation Example 2 | 0.007 | 0.052 | 0.093 |
| Comparative Example 2 | 0.020 | 0.071 | 0.108 |

Therefore, according to the present invention, the light extraction efficiency of the light-emitting device can be improved and the viewing angle dependency of the emission color can be reduced.

The foregoing description has been made by taking, as an example, a structure in which the anode is located on the substrate side and the cathode is located on the light extraction side. However, even in a case of a structure in which the cathode is located on the substrate side, the anode is located on the light extraction side, and the hole-transport layer, the emission layer, and the electron-transport layer are stacked in the reverse order, the present invention can be carried out. Therefore, the light-emitting apparatus according to the present invention is not limited to the structure in which the anode is located on the substrate side and the cathode is located on the light extraction side.

As the organic compound for use in each of the hole-transport layer 106, the emission layer 105, the electron-transport layer 107, the hole-injection layer 108, and the electron-injection layer 109 as illustrated in FIG. 3, a low-molecular material, a polymer material, or a combination thereof is used. Therefore, the organic compound is not particularly limited. If necessary, an inorganic compound may also be used.

Figure 32:
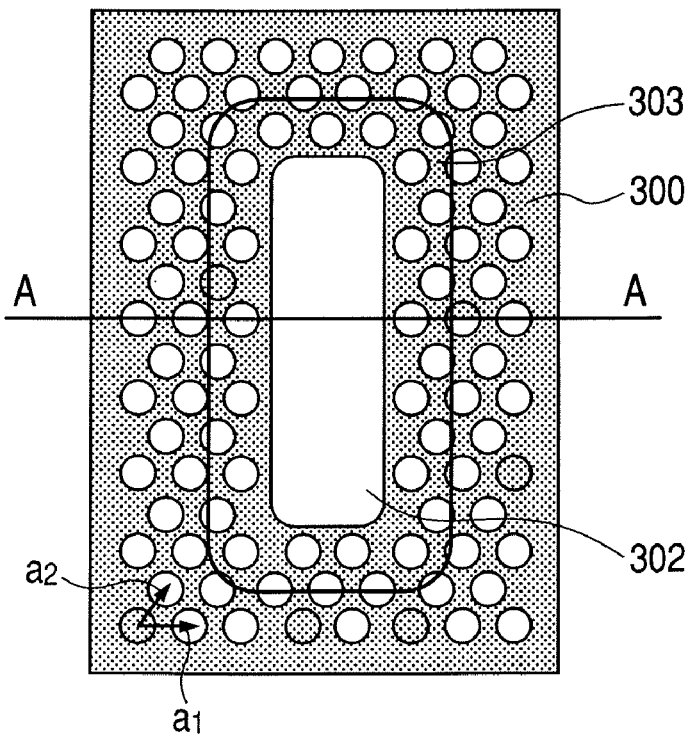
FIG. 32 is a schematic plan view illustrating an organic light-emitting apparatus which is provided on a device side surface with a periodic structure.
Figure 33:
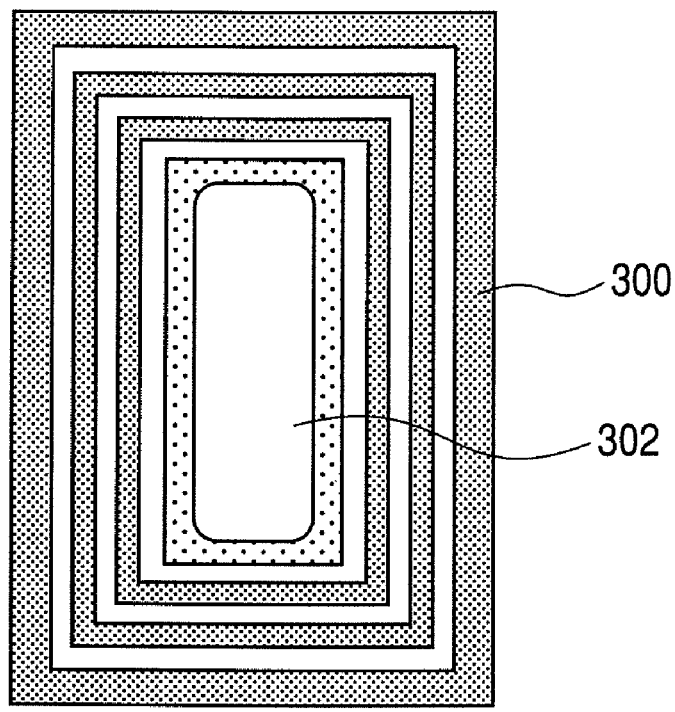
FIG. 33 is a schematic plan view illustrating an organic light-emitting apparatus which is provided on a device side surface with a periodic structure.

Further, the periodic structure 300 is not limited to the two-dimensional photonic crystal structure such as shown in FIGS. 21 and 32, and may be a combination of one-dimensional diffraction gratings such as shown in FIG. 33 or a three-dimensional photonic crystal structure. Moreover, plural kinds of periodic structures 300 having different primitive lattice vectors may be mixed. The periodic structure 300 is not necessarily completely periodic and thus may be a quasi-crystalline structure, a fractal structure, a structure whose period continuously changes, an irregular scattering structure, or a combination of a periodic structure and any one of these structures.

Figure 34:
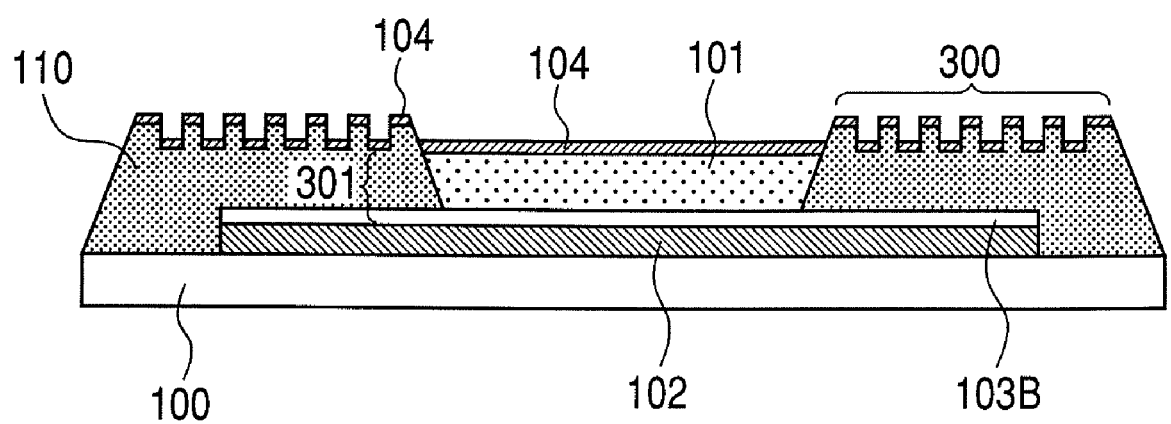
FIG. 34 is a schematic cross-sectional view illustrating an organic light-emitting apparatus which is provided on a device side surface with a periodic structure.

The above description has been made by taking, as an example, a structure in which the transparent electrode is provided as the electrode located on the light extraction side. However, as illustrated in FIG. 34, even in a case of a structure in which a translucent metal electrode 104 is provided as the electrode located on the light extraction side, the present invention can be carried out. Further, a multilayer interference film including any tow or more layers or all of a metal layer, a transparent electrode layer, and a dielectric layer can be also provided for the translucent electrode, which is located on the light extraction side.

Figure 35:
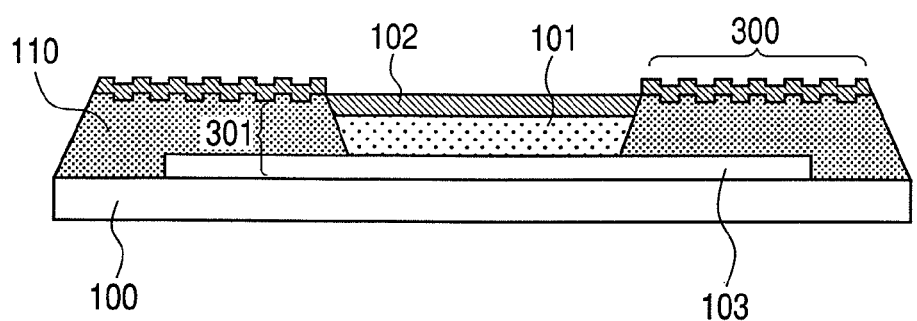
FIG. 35 is a schematic cross-sectional view illustrating a bottom-emission organic light-emitting apparatus which is provided on a device side surface with a periodic structure.

Further, as shown in FIG. 35, even in a case of a bottom-emission structure in which the substrate side is the light extraction side, the present invention can be carried out.

Further, in FIG. 35, surface plasmon is generated which propagates in the direction parallel to the substrate through an interface between the reflective electrode 102 made of metal and the organic layer 101 or an interface between the reflective electrode 102 and the device separation film 110, and which may be considered as a kind of guided-wave light. Therefore, the interface between the reflective electrode 102 and the organic layer 101 or the interface between the reflective electrode 102 and the device separation film 110 can be used as an optical waveguide. When the propagation coefficient $\beta_{sp}$ of the surface plasmon is set as the propagation coefficient $\beta$ of Expression 5, the diffraction condition is expressed by Expression 6 as is the case with normal guided-wave light. The interface at which surface plasmon is generated is not limited to an interface between a metal and a transparent electrode, but also includes an interface between a metal and an organic layer or an interface between a metal and a dielectric layer.

The foregoing description has been made by taking, as an example, an OLED device. Even in a case of a semiconductor LED, an inorganic EL device, or a QD-LED, the present invention can be carried out.

EXAMPLES

Hereinafter, examples of the present invention will be described. However, the present invention is not limited in any manner by the examples.

Example 1

Figure 36:
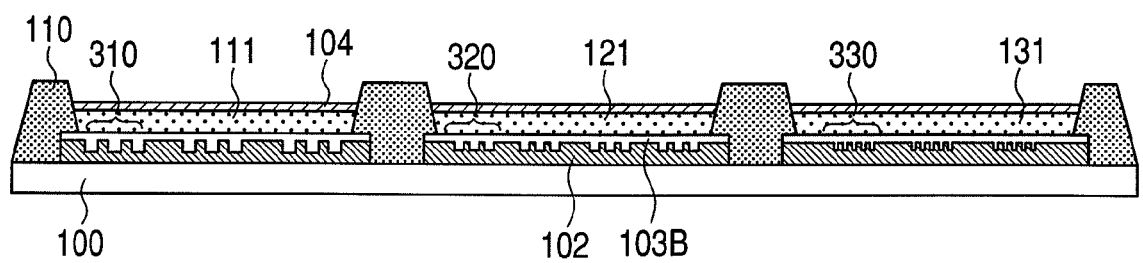
FIG. 36 is a schematic cross-sectional view illustrating an organic light-emitting apparatus which is a discrete RGB pixelation type and have a periodic structure on a reflective surface.

A full-color organic light-emitting apparatus having a structure illustrated in FIG. 36 is produced by the following method. In other words, the light-emitting apparatus according to Example 1 of the present invention is an organic light-emitting apparatus which includes a plurality of pixels each having subpixels of a plurality of colors (red light emission, green light emission, and blue light emission). At least one of the subpixels is constituted of an OLED device.

First, a TFT drive circuit constituted of low temperature polysilicon is formed on a glass substrate serving as a support member, and a planarizing film made of an acrylic resin is formed thereon, thereby obtaining the substrate 100. An Ag alloy film having a thickness of approximately 150 nm is formed as the reflective electrode 102 on the substrate 100 by sputtering. The reflective electrode 102 made of Ag alloy is a high-reflective electrode whose spectral reflectance is 80% or more in the visible light wavelength region ($\lambda$=380 nm to 780 nm). Further, for example, an Al alloy may be used instead of the Ag alloy.

A positive resist is spin-coated on the reflective electrode 102 and then pre-baked. After that, a periodic structure pattern of the square grating such as illustrated in FIG. 2 is exposed on the resist, developed, and post-baked to form a patterned resist.

The periodic structure 300 is formed in the surface of the reflective electrode 102 by etching processing. In Example 1 of the present invention, the R-periodic structure 310 has a period of 345 nm, a side length of 200 nm, and an etching depth of 40 nm. The G-periodic structure 320 has a period of 250 nm, a side length of 140 nm, and an etching depth of 40 nm. The B-periodic structure 330 has a period of 200 nm, a side length of 145 nm, and an etching depth of 40 nm. In each of the R-, G-, and B-periodic structures, a region in which the periodic structure 300 is provided and a flat region are alternatively arranged at every ten periods.

Next, the etched portion of the periodic structure 300 which is recessed is planarized by an IZO lift-off process. In a state where the patterned resist is left, an IZO film as a transparent conductive material is formed in a thickness of 40 nm by sputtering. In the etched portion, the IZO film is formed on the Ag alloy film, while in a portion except the etched portion, the IZO film is formed on the patterned resist. Then, the resist is stripped to remove the IZO on the resist together, thereby performing planarization. After that, an IZO film is formed on the resultant glass substrate in a thickness of 20 nm by sputtering, followed by electrode patterning to form an anode with a photonic crystal.

In the square grating such as illustrated in FIG. 2, the periods (arrangements) of the periodic structure 310 (320, 330) of respective subpixels in the up and down direction and the right and left direction are equal to each other. Therefore, when the light-emitting apparatus is visually observed, the same optical characteristics can be obtained in the up and down directions and the right and left directions to thereby improve the visibility. Alternatively, a rectangular grating whose periods in the up and down direction and the right and left direction are different from each other may be used. In this case, the visibility can be adjusted according to the direction. Further, when different type square gratings are combined such as illustrated in FIG. 16, the same optical characteristics can be obtained in the up and down direction, the right and left direction, and the oblique directions to thereby improve the visibility.

The device separation film 110 made of SiN$_x$O$_y$ is formed at a thickness of 320 nm. Then, an opening serving as the EL region is formed for each subpixel by etching to produce an anode substrate in which photonic crystals are arranged.

The anode substrate is ultrasonically cleaned with isopropyl alcohol (IPA), washed with boiled water, and then dried. After that, the substrate is cleaned with UV/ozone and organic layers 111, 121, and 131 are formed for R, G, and B by vacuum evaporation.

First, a film of Compound 1 represented by the following structural formula is formed for respective subpixels using a shadow mask. An R-hole-transport layer is formed in a thickness of 215 nm. A G-hole-transport layer is formed in a thickness of 155 nm. A B-hole-transport layer is formed in a thickness of 105 nm. In this case, the degree of vacuum is $1\times10^{-4}$ Pa and the evaporation rate is 0.2 nm/sec.

Compound 1

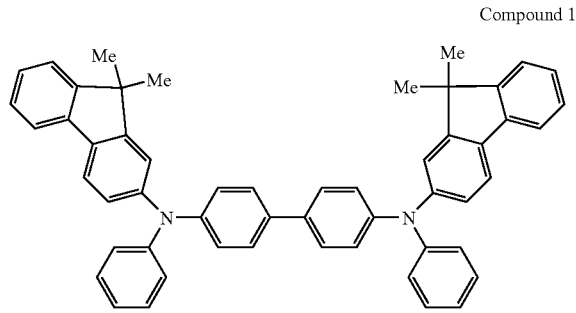

Next, R-, G-, and B-emission layers are respectively formed using a shadow mask. The R-emission layer is formed in a thickness of 30 nm by coevaporation using 4,4'-bis(N-carbazole) biphenyl (hereinafter referred to as CBP) as a host and phosphorescent compound bis[2-(2'-benzothienyl) pyridinato-N,C3] (acetylacetonato) iridium (hereinafter referred to as Btp2Ir(acac)). The G-emission layer is formed in a thickness of 30 nm by coevaporation using tris-(8-hydroxyquinoline) aluminum (hereinafter referred to as Alq3) as a host and light-emitting compound 3-(2'-benzothiazolyl)-7-N,N-diethylaminocoumarin (hereinafter referred to as coumarin-6). The B-emission layer is formed in a thickness of 30 nm by coevaporation using Compound 2 represented by the following structural formula as a host and light-emitting Compound 3 represented by the following structural formula. The degree of vacuum during evaporation is $1\times10^{-4}$ Pa and the film formation rate is 0.2 nm/sec.

Compound 2

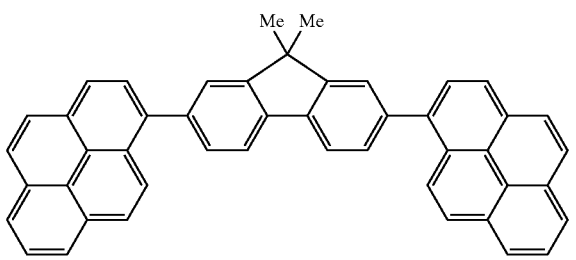

Compound 3

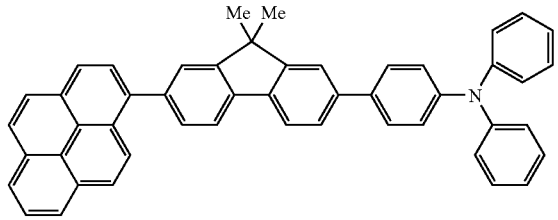

Then, a common electron-transport layer is formed in a thickness of 10 nm by vacuum evaporation using 1,10-bathophenanthroline (hereinafter referred to as BPhen). The degree of vacuum during evaporation is $1\times10^{-4}$ Pa and the film formation rate is 0.2 nm/sec. Then, a common electron-injection layer is formed in a thickness of 30 nm by coevaporation using BPhen and Cs$_2$CO$_3$ (weight ratio of 90:10). The degree of vacuum during evaporation is $3\times10^{-4}$ Pa and the film formation rate is 0.2 nm/sec.

After the formation of the electron-injection layer, the resultant substrate is transferred into a sputtering apparatus without breaking vacuum, and an Ag alloy film having a thickness of 24 nm is formed as the translucent metal electrode 104 by sputtering.

Then, as illustrated in FIG. 18, a silica film having a thickness of 290 nm is formed as the dielectric layer 104B by sputtering.

Further, a desiccant is provided in the peripheral part of the light-emitting apparatus, followed by sealing with etched cap glass to obtain the organic light-emitting apparatus.

Example 2

The procedure up to and including the formation of the resist patter in Example 1 is followed.

Then, as illustrated in FIG. 15, the periodic structure 300 which protrudes upward is formed in the surface of the reflective electrode 102 by a lift-off process. An Ag alloy film is formed in a thickness of 20 nm by sputtering. In the exposed portion of the positive resist, the Ag alloy film is formed on the reflective electrode 102, while in a portion except the exposed portion of the positive resist, the Ag alloy film is formed on the resist. Then, the resist is stripped to remove the Ag alloy on the resist together, thereby forming the periodic structure 300 which protrudes upward.

In Example 2, the R-periodic structure 310 has a period of 345 nm, a side length of 200 nm, and a height of 20 nm. The G-periodic structure 320 has a period of 250 nm, a side length of 140 nm, and a height of 20 nm. The B-periodic structure 330 has a period of 200 nm, a side length of 145 nm, and a height of 20 nm. In each of the R-, G-, and B-periodic structures, the region in which the periodic structure 300 is provided and the flat region are alternatively arranged at every ten periods.

Next, the patterned resist is removed by a remover. An IZO film made of a transparent conductive material is formed in a thickness of 80 nm by sputtering. Then, electrode patterning is performed to form an anode with a photonic crystal. The height of the periodic structure 300 located on the reflective electrode is decreased and the thickness of the transparent electrode 103B located on the reflective electrode is increased, thereby improving the flatness.

Further, the device separation film 110 made of SiN$_x$O$_y$ is formed in a thickness of 320 nm. Then, an opening serving as the EL region is formed for each subpixel by etching to produce an anode substrate in which photonic crystals are arranged.

The anode substrate is ultrasonically cleaned with isopropyl alcohol (IPA), washed with boiled water, and then dried. After that, the substrate was cleaned with UV/ozone and organic layers 111, 121, and 131 are formed for R, G, and B by vacuum evaporation.

A film of Compound 1 is formed for respective subpixels using a shadow mask. The R-hole-transport layer is formed in a thickness of 150 nm. The G-hole-transport layer is formed in a thickness of 90 nm. The B-hole-transport layer is formed in a thickness of 40 nm. At this time, the degree of vacuum is $1\times10^{-4}$ Pa and the evaporation rate is 0.2 nm/sec. The same procedure as in Example 1 is followed between the formation of the emission layer and the formation of the electron-injection layer.

After the formation of the electron-injection layer, the resultant substrate is transferred into a sputtering apparatus without breaking vacuum, and an Ag alloy film having a thickness of 20 nm is formed as the metal translucent electrode 104 by sputtering.

Then, as illustrated in FIG. 18, a silica film having a thickness of 70 nm is formed as the dielectric layer 104B by sputtering.

Further, a desiccant is provided in a peripheral part of the light-emitting apparatus, followed by sealing with etched cap glass to obtain the organic light-emitting apparatus.

Example 3

Figure 37:
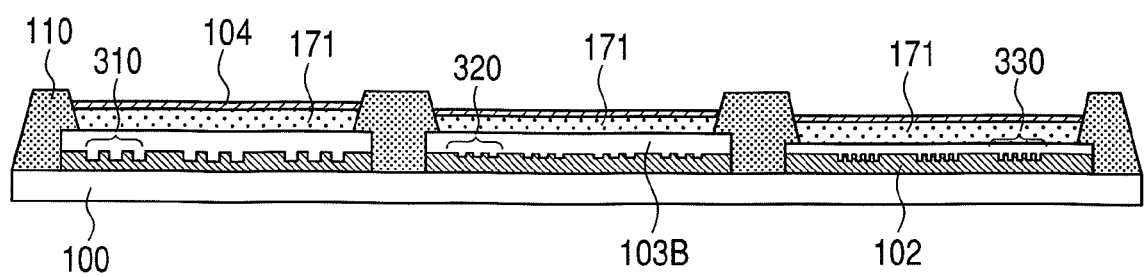
FIG. 37 is a schematic cross-sectional view illustrating an organic light-emitting apparatus which is a White common layer type and have a periodic structure on a reflective surface.

FIG. 37 is a structural view illustrating an organic light-emitting apparatus according to Example 3. The procedure up to and including the formation of the hole-transport layer in Example 1 is followed. A common three-color stack type white (W) emission layer is formed to have the following stack structure. A layer is formed in a thickness of 25 nm by coevaporation using CBP and bis[(4,6-difluorophenyl) pyridinato-N, C2] (picolinato) iridium (hereinafter referred to as FIrpic) (weight ratio of 94:6). Then, a layer is formed in a thickness of 2 nm by coevaporation using CBP and Btp2Ir (acac) (weight ratio of 92:8). Then, a layer is formed in a thickness of 2 nm by coevaporation using CBP and bis(2-phenylbenzothiozolato-N—C2) iridium(acetylacetonate) (hereinafter referred to as Bt2Ir(acac)) (weight ratio of 92:8). Thereafter, the procedure including and subsequent to the formation of the electron-transport layer in Example 1 is followed.

In other words, the organic light-emitting apparatus according to this example has a structure which has a W-organic layer 171 formed for respective subpixels and has a white color OLED device.

Comparative Example 3

The procedure up to and including the formation of the reflective layer 102 in Example 1 is followed. An IZO film is formed in a thickness of 20 nm by sputtering. Then, electrode patterning is performed to form an anode. Thereafter, the procedure including and subsequent to the formation of the hole-transport layer in Example 1 is followed. In other words, the periodic structure is not provided.

Table 5 illustrates evaluation values obtained by numerical calculation on an emission intensity ratio (intensity ratio at peak wavelength of light emission spectrum) and the CIE chromaticity change $\Delta u'v'$ (viewing angle $\theta=60°$ of each of the R-, G-, and B-subpixels in Example 1 and Comparative Example 3. In each of the R-, G-, and B-subpixels, the emission efficiency is improved and the chromaticity change is reduced.

TABLE 5

|  |  | R | G | B |
|---|---|---|---|---|
| Example 1 | Emission intensity | 1.79 | 1.78 | 1.77 |
|  | CIE chromaticity change | 0.014 | 0.044 | 0.069 |
| Comparative Example 3 | Emission intensity | 1.0 | 1.0 | 1.0 |
|  | CIE chromaticity change | 0.024 | 0.052 | 0.084 |

Example 4

Figure 38:
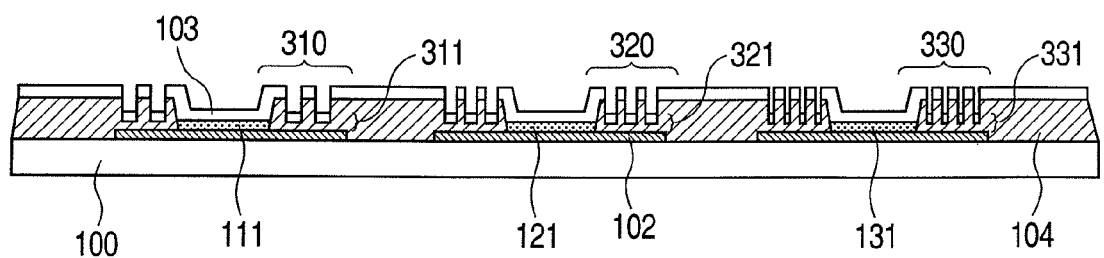
FIG. 38 is a schematic cross-sectional view illustrating an organic light-emitting apparatus which is a discrete RGB pixelation type and have a periodic structure on a device side surface.

A full-color organic light-emitting apparatus having a structure illustrated in FIG. 38 is produced by the following method. In other words, the light-emitting apparatus according to Example 4 of the present invention is an organic light-emitting apparatus which includes a plurality of pixels each having subpixels of a plurality of colors (red light emission, green light emission, and blue light emission). At least one of the subpixels is constituted of an OLED device.

A TFT drive circuit constituted of low temperature polysilicon is formed on a glass substrate serving as a support member, and a planarizing film made of an acrylic resin is formed thereon, thereby obtaining the substrate 100. An Ag alloy film having a thickness of approximately 150 nm is formed as the reflective electrode 102 on the substrate 100 by sputtering. The reflective electrode 102 made of Ag alloy is a high-reflective electrode whose spectral reflectance is 80% or more in the visible light wavelength region (A=380 nm to 780 nm). Further, for example, an Al alloy may be used instead of the Ag alloy.

An IZO film having a thickness of 20 nm is formed as the transparent electrode located on the reflective electrode by sputtering. Then, electrode patterning is performed to form an anode.

Then, the device separation film 110 made of $SiN_xO_y$ is formed in a thickness of 175 nm. Then, the EL region 302 such as illustrated in FIG. 21 and the periodic structure 310 (320, 330) of the square grating are formed for respective subpixels by etching to produce an anode substrate with a photonic crystal.

Here, the EL region 302 is 50 μm square. In Example 4 of the present invention, the R-periodic structure 310 has a period of 290 nm, an etching diameter of 200 nm, and an etching depth of 40 nm. The G-periodic structure 320 has a period of 250 nm, an etching diameter of 175 nm, and an etching depth of 90 nm. The B-periodic structure 330 has a period of 230 nm, an etching diameter of 155 nm, and an etching depth of 115 nm.

In the square grating such as illustrated in FIG. 2, the periods (arrangements) of the periodic structure 310 (320, 330) of respective subpixels in the up and down direction and the right and left direction are equal to each other. Therefore, when the light-emitting apparatus is visually observed, the same optical characteristics can be obtained in the up and down directions and the right and left directions to thereby improve the visibility. Alternatively, a rectangular grating whose periods in the up and down direction and the right and left direction are different from each other may be used. In this case, the visibility can be adjusted according to the direction. Further, when different type square gratings are combined, the same optical characteristics can be obtained in the up and down direction, the right and left direction, and the oblique directions to thereby improve the visibility.

The anode substrate is ultrasonically cleaned with isopropyl alcohol (IPA), washed with boiled water, and then dried. After that, the substrate is cleaned with UV/ozone and organic layers 111, 121, and 131 are formed for R, G, and B by vacuum evaporation.

A film of Compound 1 is formed for respective subpixels using a shadow mask. An R-hole-transport layer is formed in a thickness of 25 nm. A G-hole-transport layer is formed in a thickness of 25 nm. A B-hole-transport layer is formed in a thickness of 20 nm. In this case, the degree of vacuum is $1\times10^{-4}$ Pa and the evaporation rate is 0.2 nm/sec.

Next, respective R-, G-, and B-emission layers are formed using a shadow mask. The R-emission layer is formed in a thickness of 50 nm by coevaporation using CBP as a host and phosphorescent compound Btp2Ir(acac). The G-emission layer is formed in a thickness of 30 nm by coevaporation using Alq3 as a host and light-emitting compound coumarin-6. The B-emission layer is formed in a thickness of 20 nm by coevaporation using Compound 2 as a host and light-emitting Compound 3. The degree of vacuum during evaporation is $1\times10^{-4}$ Pa and the film formation rate is 0.2 nm/sec.

Then, a common electron-transport layer is formed in a thickness of 10 nm by vacuum evaporation using BPhen. The degree of vacuum during evaporation is $1\times10^{-4}$ Pa and the film formation rate is 0.2 nm/sec.

Then, a coevaporation film of BPhen and $Cs_2CO_3$ (weight ratio of 90:10) is formed for respective subpixels using a shadow mask. An R-electron-injection layer is formed in a thickness of 60 nm. A G-electron-injection layer is formed in a thickness of 30 nm. A B-electron-injection layer is formed in a thickness of 20 nm. The degree of vacuum during evaporation is $3\times10^{-4}$ Pa and the film formation rate is 0.2 nm/sec.

After the formation of the electron-injection layer, the resultant substrate is transferred into a sputtering apparatus without breaking vacuum, and an IZO film having a thickness of 60 nm is formed as the transparent electrode 103 by sputtering.

Further, a desiccant is provided in a peripheral part of the light-emitting apparatus, followed by sealing with etched cap glass to obtain the organic light-emitting apparatus.

Example 5

Figure 39:
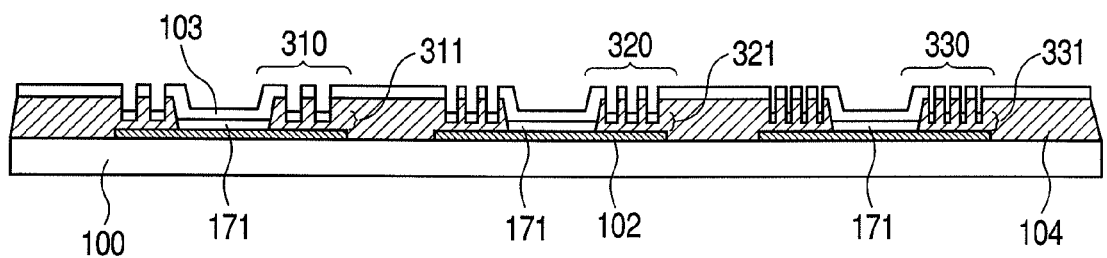
FIG. 39 is a schematic cross-sectional view illustrating an organic light-emitting apparatus which is a White common layer type and have a periodic structure on a device side surface.

FIG. 39 is a structural view illustrating an organic light-emitting apparatus according to Example 5. The procedure up to and including the formation of the anode substrate in Example 4 is followed. The thus formed anode substrate is ultrasonically cleaned with isopropyl alcohol (IPA), washed with boil water, and then dried.

A film of Compound 1 is formed for respective subpixels using a shadow mask. An R-hole-transport layer is formed in a thickness of 45 nm. A G-hole-transport layer is formed in a thickness of 25 nm. A B-hole-transport layer is formed in a thickness of 10 nm. At this time, the degree of vacuum is $1\times10^{-4}$ Pa and the evaporation rate is 0.2 nm/sec.

Next, a common three-color stack type white (W) emission layer is formed so as to have the following stack structure. A layer is formed in a thickness of 25 nm by coevaporation using CBP and FIrpic (weight ratio of 94:6). Then, a layer is formed in a thickness of 2 nm by coevaporation using CBP and Btp2Ir(acac) (weight ratio of 92:8). Then, a layer is formed in a thickness of 2 nm by coevaporation using CBP and Bt2Ir(acac)) (weight ratio of 92:8). Thereafter, the procedure including and subsequent to the formation of the electron-transport layer in Example 4 is followed.

In other words, the organic light-emitting apparatus according to this Example 5 has a structure which has a W-organic layer 171 formed for respective subpixels and has a white color OLED device.

Comparative Example 4

An organic light-emitting apparatus is produced by following the same procedure as in Example 4 with the exception that the device separation film 110 does not have a periodic structure.

Table 6 illustrates evaluation values obtained by numerical calculation on an emission intensity ratio (intensity ratio at peak wavelength of light emission spectrum) and the CIE chromaticity change $\Delta u'v'$ (viewing angle $\theta=60°$ of each of the R-, G-, and B-subpixels in Example 4 and Comparative Example 4. In each of the R-, G-, and B-subpixels, the emission efficiency is improved and the chromaticity change is reduced.

TABLE 6

|  |  | R | G | B |
|---|---|---|---|---|
| Example 4 | Emission intensity | 1.17 | 1.70 | 1.62 |
|  | CIE chromaticity change | 0.027 | 0.024 | 0.093 |
| Comparative Example 4 | Emission intensity | 1.0 | 1.0 | 1.0 |
|  | CIE chromaticity change | 0.066 | 0.025 | 0.108 |

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structure and functions.

This application claims the benefit of Japanese Patent Application Nos. 2007-295974, filed Nov. 14, 2007 and 2008-278327, filed Oct. 29, 2008, which are hereby incorporated by reference in their entirety.

The invention claimed is:

1. A light-emitting apparatus comprising:
   a substrate;
   a plurality of light-emitting devices formed on the substrate and each comprising a first electrode formed on the substrate, an emission layer formed on the first electrode, and a second electrode formed on the emission layer;
   a cavity structure for resonating light emitted from the emission layer between a first reflective surface and a second reflective surface; and
   a periodic structure for extracting guided-wave light generated between the first reflective surface and the second reflective surface to outside,
   wherein when the guided-wave light is diffracted by the periodic structure at an angle which is larger than 90° and smaller than 180° relative to a guided-wave direction, a wavelength of the diffracted light becomes longer as the angle increases,
   wherein primitive reciprocal lattice vectors b1, b2 of the periodic structure satisfy:

$$n_{ext} < \frac{\lambda}{2\pi}|m_1 b_1 + m_2 b_2| < n + n_{ext};$$

and
   wherein n is a refractive index of the emission layer, $n_{ext}$ is a refractive index of a light extraction side medium, $\lambda$ is a peak wavelength of a spectrum of light extracted to outside through the periodic structure, and $m_1$ and $m_2$ are integers.

2. The light-emitting apparatus according to claim 1, wherein the periodic structure is formed between the first reflective surface and the second reflective surface, in the first reflective surface, or in the second reflective surface, and wherein a light-emitting region of the light-emitting device has a region with the periodic structure and a flat region formed therein.

3. The light-emitting apparatus according to claim 1, further comprising a light transmission member which covers a peripheral edge of the first electrode, wherein the second electrode is formed on the emission layer and the light transmission member, and
wherein the periodic structure is formed on a side of the light transmission member opposite to the substrate side and diffracts the guided-wave light that has passed through a waveguide formed between the first electrode and the periodic structure.

4. The light-emitting apparatus according to claim 1, wherein an emission spectrum of the diffracted light has a maximum intensity in a direction in which with the angle is larger than 90°.

5. The light-emitting apparatus according to claim 1, wherein a period a of the periodic structure satisfies:

$$\frac{\sqrt{m_1^2 + m_2^2}}{n + n_{ext}} \lambda < a < \frac{\sqrt{m_1^2 + m_2^2}}{n_{ext}} \lambda$$

where n is a refractive index of the emission layer, $n_{ext}$ is a refractive index of a light extraction side medium, $\lambda$ is a peak wavelength of a spectrum of light extracted to outside through the periodic structure, and $m_1$ and $m_2$ are integers.

6. The light-emitting apparatus according to claim 1, wherein the periodic structure has a four-fold symmetry.

7. The light-emitting apparatus according to claim 1, wherein the plurality of light-emitting devices comprise a light-emitting device for red light emission, a light-emitting device for green light emission, and a light-emitting device for blue light emission, and wherein the periodic structure of the light-emitting device for red light emission is longest in period, and the periodic structure of the light-emitting device for blue light emission is shortest in period.

8. The light-emitting apparatus according to claim 1, wherein the periodic structure has a period of 125 nm or more and 780 nm or less.

9. The light-emitting apparatus according to claim 1, wherein a distance between the first reflective surface and the second reflective surface is 70 nm or more and 715 nm or less.

10. The light-emitting apparatus according to claim 1, wherein the light-emitting device is an OLED device.

11. The light-emitting apparatus according to claim 1, wherein the first reflective surface is located on the first electrode side relative to the emission layer and the second reflective surface is located on the second electrode side relative to the emission layer.

12. A light-emitting apparatus comprising:
a substrate;
a plurality of light-emitting devices formed on the substrate and each comprising a first electrode formed on the substrate, an emission layer formed on the first electrode, and a second electrode formed on the emission layer;
a cavity structure for resonating light emitted from the emission layer between a first reflective surface and a second reflective surface; and
a periodic structure for extracting guided-wave light generated between the first reflective surface and the second reflective surface to outside,
wherein when the guided-wave light is diffracted by the periodic structure at an angle which is larger than 90° and smaller than 180° relative to a guided-wave direction, a wavelength of the diffracted light becomes longer as the angle increases, and
wherein the periodic structure has a period of 125 nm or more and 780 nm or less.

13. A light-emitting apparatus comprising:
a substrate;
a plurality of light-emitting devices formed on the substrate and each comprising a first electrode formed on the substrate, an emission layer formed on the first electrode, and a second electrode formed on the emission layer;
a cavity structure for resonating light emitted from the emission layer between a first reflective surface and a second reflective surface; and
a periodic structure for extracting guided-wave light generated between the first reflective surface and the second reflective surface to outside,
wherein when the guided-wave light is diffracted by the periodic structure at an angle which is larger than 90° and smaller than 180° relative to a guided-wave direction, a wavelength of the diffracted light becomes longer as the angle increases, and
wherein a distance between the first reflective surface and the second reflective surface is 70 nm or more and 715 nm or less.

* * * * *